United States Patent
Bell (12)

(10) Patent No.: US 6,539,725 B2
(45) Date of Patent: Apr. 1, 2003

(54) EFFICIENCY THERMOELECTRICS UTILIZING THERMAL ISOLATION

(75) Inventor: Lon E. Bell, Altadena, CA (US)

(73) Assignee: BSST LLC, Irwindale, CA (US)

( * ) Notice: Subject to any disclaimer, the term of this patent is extended or adjusted under 35 U.S.C. 154(b) by 0 days.

(21) Appl. No.: 09/844,818

(22) Filed: Apr. 27, 2001

(65) Prior Publication Data

US 2002/0139123 A1 Oct. 3, 2002

Related U.S. Application Data

(60) Provisional application No. 60/267,657, filed on Feb. 9, 2001.

(51) Int. Cl.[7] .............................................. F25B 21/02
(52) U.S. Cl. ................... 62/3.7; 62/3.3; 62/3.2
(58) Field of Search ............................. 62/3.7, 3.3, 3.2

(56) References Cited

U.S. PATENT DOCUMENTS

| | | | | |
|---|---|---|---|---|
| 3,635,037 A | * | 1/1972 | Hubert ............................. | 62/3 |
| 3,681,929 A | * | 8/1972 | Schering ......................... | 62/3 |
| 3,779,814 A | * | 12/1973 | Miles et al. ................. | 136/236 |
| 4,065,936 A | | 1/1978 | Fenton et al. | |
| 4,730,459 A | * | 3/1988 | Schlicklin et al. ................. | 62/3 |
| 5,092,129 A | | 3/1992 | Bayes et al. | |
| 5,228,923 A | | 7/1993 | Hed | |
| 5,232,516 A | | 8/1993 | Hed | |
| 5,802,856 A | * | 9/1998 | Schaper et al. ................ | 62/3.7 |
| 6,084,172 A | * | 7/2000 | Kishi et al. ................. | 136/200 |
| 6,334,311 B1 | * | 1/2002 | Kim et al. ..................... | 62/3.2 |
| 6,346,668 B1 | | 2/2002 | McGrew | |
| 6,347,521 B1 | * | 2/2002 | Kadotani et al. ............. | 62/3.7 |

OTHER PUBLICATIONS

A New Concept for Improving Thermoelectric Heat Pump Efficiency, R.J. Buist, J.W. Fenton and J.S. Lee, Borg–Warner Thermoelectrics Wolf and Algonquin Road.

A New Concept of Porous thermoelectric Module Using a Reciprocating Flow for Cooling/heating System (Numerical Analysis for Heating System), Shigeru Tada, Ryozo Echigo and Hideo Yoshida, $16^{th}$ International Conference on Thermoelectrics (1997).

H.J. Goldsmid, *Electronic Refrigeration*, Pion Ltd, 207 Brondesbury Park, London (1986).

Stanley W. Angrist, *Direct Energy Conversion*, 32 Ed. Ally & Bacon (1976).

International Search Report dated Jun. 12, 2002.

* cited by examiner

Primary Examiner—William C. Doerrler
Assistant Examiner—Mark S. Shulman
(74) Attorney, Agent, or Firm—Knobbe Martens Olson & Bear LLP

(57) ABSTRACT

An improved efficiency thermoelectric system and method of making such a thermoelectric system are disclosed. Significant thermal isolation between thermoelectric elements in at least one direction across a thermoelectric system provides increased efficiency over conventional thermoelectric arrays. Significant thermal isolation is also provided for at least one heat exchanger coupled to the thermoelectric elements. In one embodiment, the properties, such as resistance or current flow, of the thermoelectric elements may also be varied in at least one direction across a thermoelectric array. In addition, the mechanical configuration of the thermoelectric elements may be varied, in one embodiment, according to dynamic adjustment criteria.

88 Claims, 24 Drawing Sheets

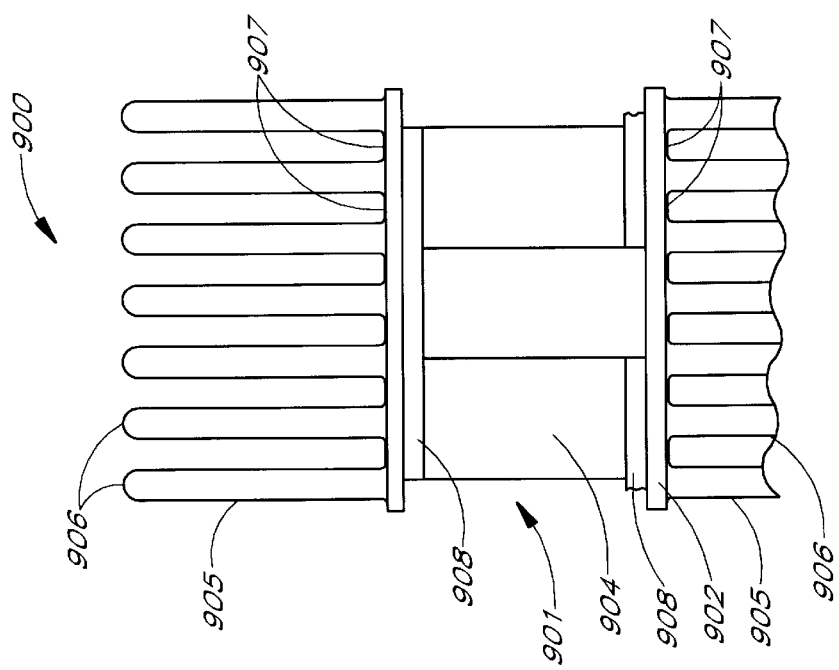
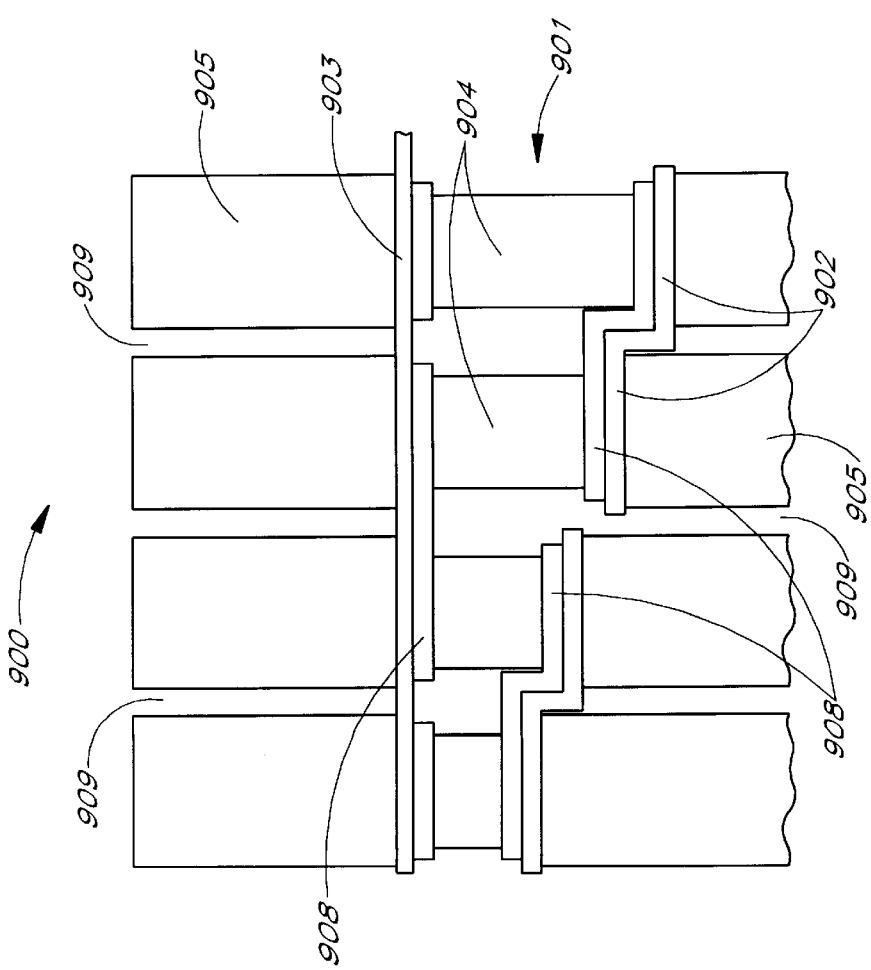
FIG. 9A
FIG. 9B

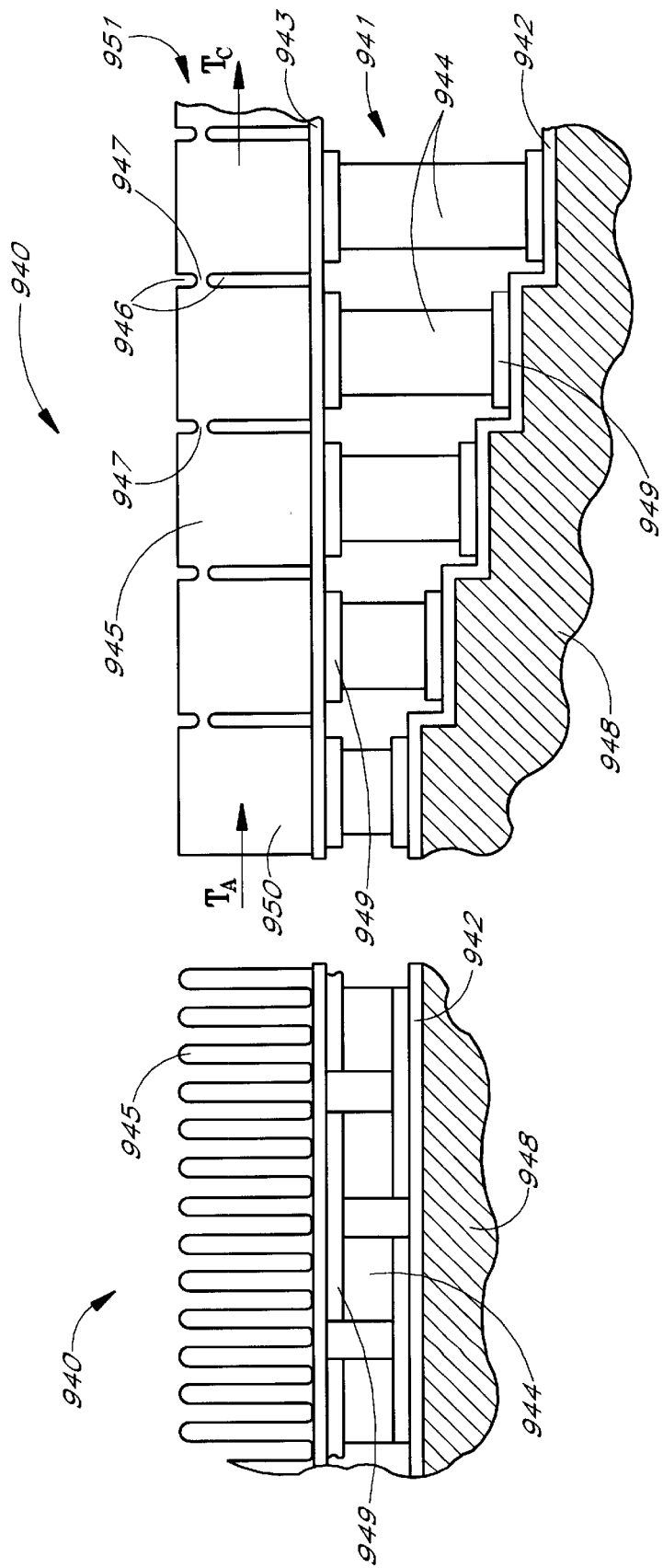

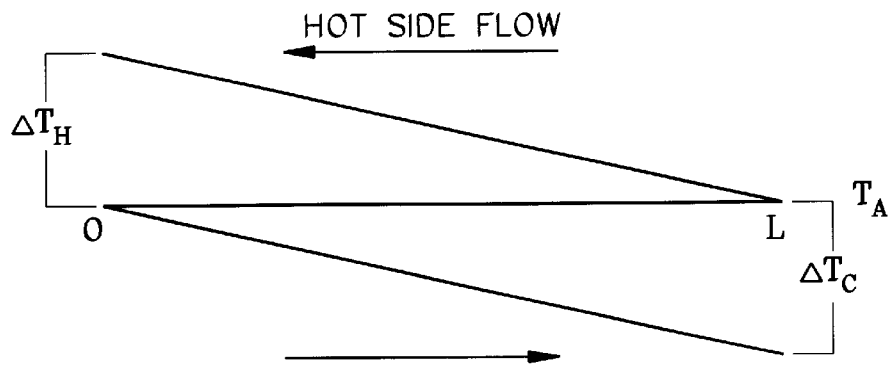
FIG. 15A      $\Delta T_C = \Delta T_H$
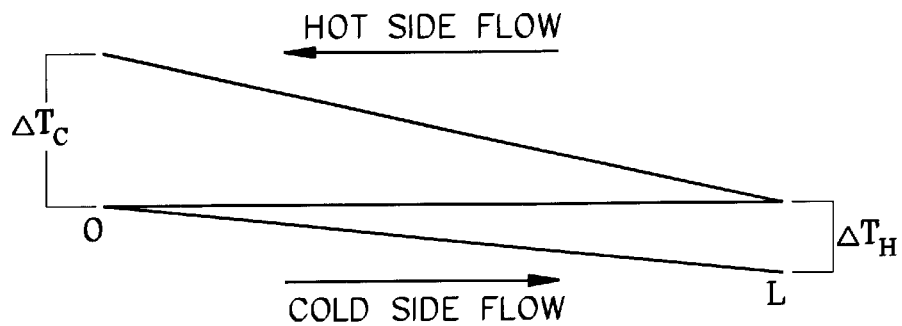
FIG. 15B      $\Delta T_C > \Delta T_H$
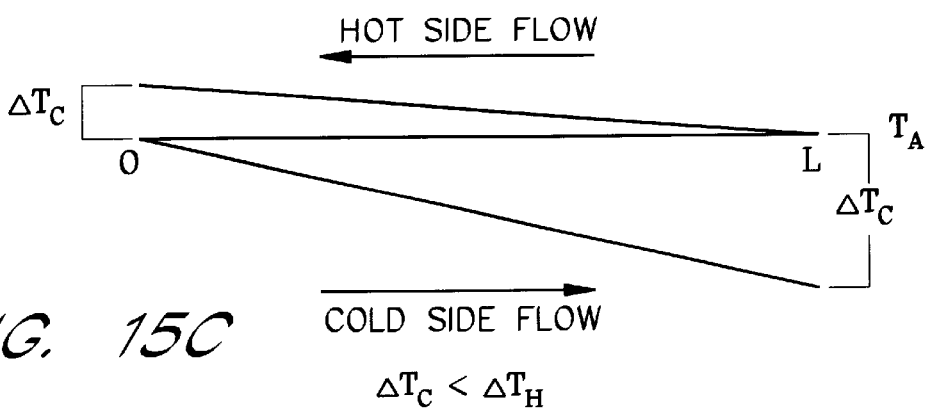
FIG. 15C      $\Delta T_C < \Delta T_H$
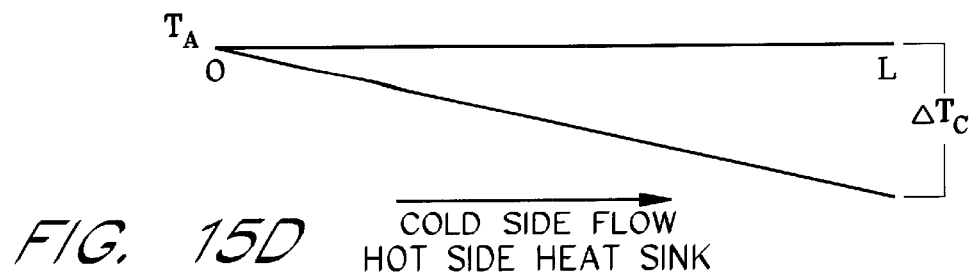
FIG. 15D      HOT SIDE HEAT SINK

EFFICIENCY THERMOELECTRICS UTILIZING THERMAL ISOLATION

REFERENCE TO PRIOR PROVISIONAL APPLICATION

This Application is related to and claims the benefit of the filing date of prior filed U.S. Provisional Patent Application No. 60/267,657 filed Feb. 9, 2001.

BACKGROUND OF THE INVENTION

1. Field of the Invention

The present invention relates to improved thermoelectrics for producing heat and/or cold conditions with a greater efficiency.

2. Description of the Related Art

Thermoelectric devices (TEs) utilize the properties of certain materials to develop a thermal gradient across the material in the presence of current flow. Conventional thermoelectric devices utilize P-type and N-type semiconductors as the thermoelectric material within the device. These are physically and electrically configured in such a manner that the desired function of heating or cooling.

Some fundamental equations, theories, studies, test methods and data related to TEs for cooling and heating are described in H. J. Goldsmid, *Electronic Refrigeration*, Pion Ltd., 207 Brondesbury Park, London, NW2 5JN, England (1986). The most common configuration used in thermoelectric devices today is illustrated in FIG. 1. Generally, P-type and N-type thermoelectric elements 102 are arrayed in a rectangular assembly 100 between two substrates 104. A current, I, passes through both element types. The elements are connected in series via copper shunts 106 soldered to the ends of the elements 102. A DC voltage 108, when applied, creates a temperature gradient across the TE elements. FIG. 2 for flow and FIG. 3 for an object both illustrate general diagrams of systems using the TE assembly 100 of FIG. 1.

When electrical current passes through the thermoelectric elements, one end of the thermoelectric elements becomes cooler and the other end becomes warmer. TE's are commonly used to cool liquids, gases and objects.

The basic equations for TE devices in the most common form are as follows:

$$q_c = \alpha I T_c - \frac{1}{2} I^2 R - K \Delta T \quad (1)$$

$$q_{in} = \alpha I \Delta T + I^2 R \quad (2)$$

$$q_h = \alpha I T_h + \frac{1}{2} I^2 R - K \Delta T \quad (3)$$

where $q_c$ is the cooling rate (heat content removal rate from the cold side), $q_{in}$ is the power input to the system, and $q_h$ is the heat output of the system, wherein:

$\alpha$=Seebeck Coefficient
I=Current Flow
$T_c$=Cold side absolute temperature
$T_h$=Hot side absolute temperature
R=Electrical resistance
K=Thermal conductance Herein $\alpha$, R and K are assumed constant, or suitably averaged values over the appropriate temperature ranges.

Under steady state conditions the energy in and out balances:

$$q_c + q_{in} = q_h \quad (4)$$

Further, to analyze performance in the terms used within the refrigeration and heating industries, the following definitions are needed:

$$\beta = \frac{q_c}{q_{in}} = \text{Cooling Coefficient of Performance (COP)} \quad (5)$$

$$\gamma = \frac{q_h}{q_{in}} = \text{Heating COP} \quad (6)$$

From (4);

$$\frac{q_c}{q_{in}} + \frac{q_{in}}{q_{in}} = \frac{q_h}{q_{in}} \quad (7)$$

$$\beta + 1 = \gamma \quad (8)$$

So $\beta$ and $\gamma$ are closely connected, and $\gamma$ is always greater than $\beta$ by unity.

If these equations are manipulated, conditions can be found under which either $\beta$ or $\gamma$ are maximum or $q_c$ or $q_h$ are maximum.

If $\beta$ maximum is designated by, $\beta_m$, and the COP for $q_c$ maximum by, $\beta_{cm}$, the result is as follows:

$$\beta_m = \frac{T_c}{\Delta T_c} \left( \frac{\sqrt{1+ZT_m} - \frac{T_h}{T_c}}{\sqrt{1+ZT_m} + 1} \right) \quad (9)$$

$$\beta_{cm} = \left( \frac{\frac{1}{2}ZT_c - \Delta T}{ZT_cT_h} \right) \quad (10)$$

where;

$$Z = \frac{\alpha^2}{RK} = \frac{\alpha^2 \rho}{\lambda} = \text{Figure of Merit} \quad (11)$$

$$T_m = \frac{T_c + T_h}{2} \quad (12)$$

and;
Wherein:

$\lambda$=Material Thermal Conductivity; and
$\rho$=Material Electrical Resistivity Note that for simple solid shapes with parallel sides, K=$\lambda\times$area/length. Similarly R=($\rho\times$length)/area. Thus, any change in shape, such as a change in length, area, conality, etc., can affect both K and R. Also, if the shapes of flexible elements are changed by mechanical or other means, both K and R can change.

$\beta_m$ and $q_{cm}$ depend only on Z, $T_c$ and $T_h$. Thus, Z is named the figure of merit and is basic parameter that characterizes the performance of TE systems. The magnitude of Z governs thermoelectric performance in the geometry of FIG. 1, and in most all other geometries and usages of thermoelectrics today.

For today's materials, thermoelectric devices have certain aerospace and some commercial uses. However, usages are limited, because system efficiencies are too low to compete with those of most refrigeration systems employing freon-like fluids (such as those used in refrigerators, car HVAC systems, building HVAC systems, home air conditioners and the like).

The limitation becomes apparent when the maximum thermoelectric efficiency from Equation 9 is compared with $C_m$, the Carnot cycle efficiency (the theoretical maximum system efficiency for any cooling system);

$$\frac{\beta_m}{C_m} = \frac{\frac{T_c}{\Delta T}\left(\frac{\sqrt{1+ZT_m} - \frac{T_h}{T_c}}{\sqrt{1+ZT_m}+1}\right)}{\frac{T_c}{\Delta T}} = \left(\frac{\sqrt{1+ZT_m} - \frac{T_h}{T_c}}{\sqrt{1+ZT_m}+1}\right) \quad (13)$$

Note, as a check if $Z \rightarrow \infty, \beta \rightarrow C_m$. The best commercial TE materials have Z such that the product;

$ZT_a \approx 1$

Several commercial materials have a $ZT_a=1$ over some narrow temperature range, but $ZT_a$ does not exceed unity in present commercial materials. This is illustrated in FIG. 4. Some experimental materials exhibit $ZT_a=2$ to 4, but these are not in production. Generally, as better materials may become commercially available, they do not obviate the benefits of the present inventions.

Several configurations for thermoelectric devices are in current use for automobile seat cooling systems, for portable coolers and refrigerators, for high efficiency liquid systems for scientific applications, for the cooling of electronics and fiber optic systems and for cooling of infrared sensing system.

All of these devices have in common that the $T_h$ is equalized over the hot side of the TE, and similarly, $T_c$ is equalized over the cold side. In most such devices, the TEs use an alumina substrate (a good thermal conductor) for the hot and cold side end plates and copper or aluminum fins or blocks as heat exchangers on at least one side.

Thus, to a good approximation, conditions can be represented by the diagram in FIG. 5. In this case $\Delta T$ has been split into the cold side at $\Delta T_c$ and hot side $\Delta T_h$ where $\Delta T = \Delta T_c + \Delta T_h$.

Using (1) and (2) in (5):

$$\beta = \frac{q_c}{q_{in}} = \frac{\alpha I T_c - \frac{1}{2}I^2 R - K\Delta T}{\alpha I \Delta T + I^2 R} \quad (14)$$

But $\Delta T$ is the sum of $\Delta T_c$ and $\Delta T_h$. So, for example, if $\Delta T_c = \Delta T_h$ then $\Delta T = 2\Delta T_c$. Since the efficiency decreases with increasing $\Delta T$, it is highly desirable to make $\Delta T$ as small as possible. One option is to have the fluid flowing by the hot side be very large compared to that by the cold side. For this case, the equation for heat flow from the hot side is:

$$q_h = C_p M \Delta T_h \quad (15)$$

where $C_p M$ is the heat capacity of the fluid passing the hot side per unit time (e.g., per second).

Thus, if $C_p M$ is very large for a given required $q_h$, $\Delta T_h$ will be very small. However, this has the disadvantage of requiring large fans or pumps and a large volume of waste fluid (that is, fluid not cooled, but exhausted as part of the process to achieve more efficient cooling).

A second option is to make the heat sink on the hot side very large so that the heat is dissipated passively. Examples would be a low power TE in a car with the hot side in very good thermal contact with the vehicle chassis, or a TE system in a submarine with the TE in good thermal contact with the hull and hence, the ocean water. In general, however, these methods are difficult to implement or cost, weight, size or other conditions limit their use. The result is that $\Delta T$ is substantially larger than $\Delta T_c$ in most devices, and efficiency suffers accordingly.

SUMMARY OF THE INVENTION

In general, an improved efficiency thermoelectric device is achieved by subdividing the overall assembly of thermoelectric elements into thermally isolated sub-assemblies. Overall efficiency may be improved by utilizing the thermal isolation, and controlling the positioning and direction of the flow of the material to be cooled or heated through portions of the thermoelectric device. Efficiency may also be improved, by varying $\Delta T$, and physical, thermal and electrical properties of portions of the overall thermoelectric device.

One aspect of the present invention involves a thermoelectric system for use with at least one medium to be cooled or heated. The system has a plurality of thermoelectric elements forming a thermoelectric array with a cooling side and a heating side; wherein the plurality of thermoelectric elements are substantially thermally isolated from each other in at least one direction across the array. At least one heat exchanger is provided on at least one of the cooling and/or the heating sides and in thermal communication with at least one thermoelectric element. The heat exchanger is configured to significantly maintain the thermal isolation of the thermoelectric elements.

In one embodiment, the medium, such as fluid, solids or a combination of both, moves across at least a portion of at least one side of the array, in at least one direction. In another embodiment, at least one characteristic, such as resistance, of the thermoelectric elements is varied in the direction of medium movement. Resistance may be varied in a number of ways, such as variation of length of the thermoelectric elements, variation of cross-sectional area of the thermoelectric elements, variations in the mechanical configuration of each thermoelectric element, or through resistivity of at least one thermoelectric material, and in any manner appropriate to the application.

In yet another embodiment, the current through the thermoelectric elements is different for at least some thermoelectric elements in the array.

Advantageously, the heat exchanger comprises a plurality of portions, such as posts, fins, or heat pipes, each portion in thermal communication with at least one thermoelectric element, at least some of the portions substantially thermally isolated from other of said portions in the direction of medium movement. Preferably, the thermal isolation of the portions corresponds to the thermal isolation of the thermoelectric elements, thereby providing significantly thermally isolated sub-assemblies. In one embodiment, a heat exchanger is provided on each of the cooling and the heating sides. Alternatively, one side has a heat sink and one side has a heat exchanger. The heat sink may be coupled to one side of the thermoelectric array via a heat pipe that is in thermal contact with the array at one end and with a heat sink at the other end. In another embodiment, the thermoelectric elements are also subjected to at least one magnetic field.

Advantageously, at least one characteristic of the thermoelectric system is dynamically adjustable through adjustment of the mechanical configuration of the thermoelectric system. A control system coupled to the thermoelectric system may adjust the mechanical configuration based upon at least one input to the control system. Preferably, the control system operates to improve efficiency dynamically through the adjustment. An algorithm may be provided in accordance with which the control system operates. In one embodiment, the control system adjusts at least one characteristic based upon at least one input to the control system.

The various features, such as thermal isolation, variation of a characteristic, variation of current, provision of magnetic fields and control systems may be used in various combinations, or alone, for particular applications.

Another aspect of the present invention involves a method of making a thermoelectric system for use with at least one medium, such as a fluid, solid or combination of fluid and solid, to be cooled or heated. The method involves the steps of forming a plurality of thermoelectric elements into a thermoelectric array with a cooling side and a heating side; wherein the plurality of thermoelectric elements are substantially thermally isolated from each other in at least one direction across the array, and exchanging heat from at least one side of the thermoelectric array in a manner that significantly maintains the thermal isolation of the thermoelectric elements.

In one embodiment of the method, the medium is moved across at least a portion of at least one side of the array in at least one direction. Another embodiment of the method involves the further step of varying at least one characteristic, such as resistance or mechanical configuration of the thermoelectric elements in the direction of medium movement. For example, resistance could be varied in any number of ways such as varying the length, the cross-sectional area, the mechanical configuration, or the resistivity of at least some of the thermoelectric elements. In one embodiment, the step of varying comprises dynamically adjusting the at least one characteristic. Preferably, the adjustment is in response to evaluation of at least one parameter from a sensory input or by a user. An algorithm may be followed to control the adjustment.

In one embodiment, the step of exchanging heat involves providing a heat exchanger comprising a plurality of portions, each portion in thermal communication with at least one thermoelectric element, at least some of the portions substantially thermally isolated from other portions in the direction of medium movement. The portions may take on any number of configurations such as posts, fins, or heat pipes, or other suitable heat exchanger materials. In one embodiment, the step of exchanging heat involves exchanging heat on both the cooling side and the heating side. Alternatively, the method involves the step of sinking heat from at least one side of the thermoelectric array.

In another embodiment, the method further involves the step of varying the current through at least some thermoelectric elements in the array. In yet another embodiment, the method further involves the step of subjecting the thermoelectric elements to at least one magnetic field.

These and other features of the present invention are described in further detail below in connection with a number of Figures.

BRIEF DESCRIPTION OF THE DRAWINGS

The below Detailed Description of the Preferred Embodiments is made in conjunction with the following figures.

FIGS. 9A–9E depict examples of thermoelectric devices incorporating the features of FIGS. 7A–E and FIG. 8, but utilizing different geometries for the heat exchangers and thermoelectric elements;

FIGS. 15A–15G illustrate various examples of temperature profiles along the length of an isolated element thermoelectric system in accordance with the present invention;

DETAILED DESCRIPTION OF THE PREFERRED EMBODIMENTS

The present invention is introduced using examples and particular embodiments for descriptive purposes. Although a variety of examples are presented to show how various configurations can be employed to achieve the desired improvements, the particular embodiments are only illustrative and not intended in any way to restrict the inventions presented.

Figure 1A:
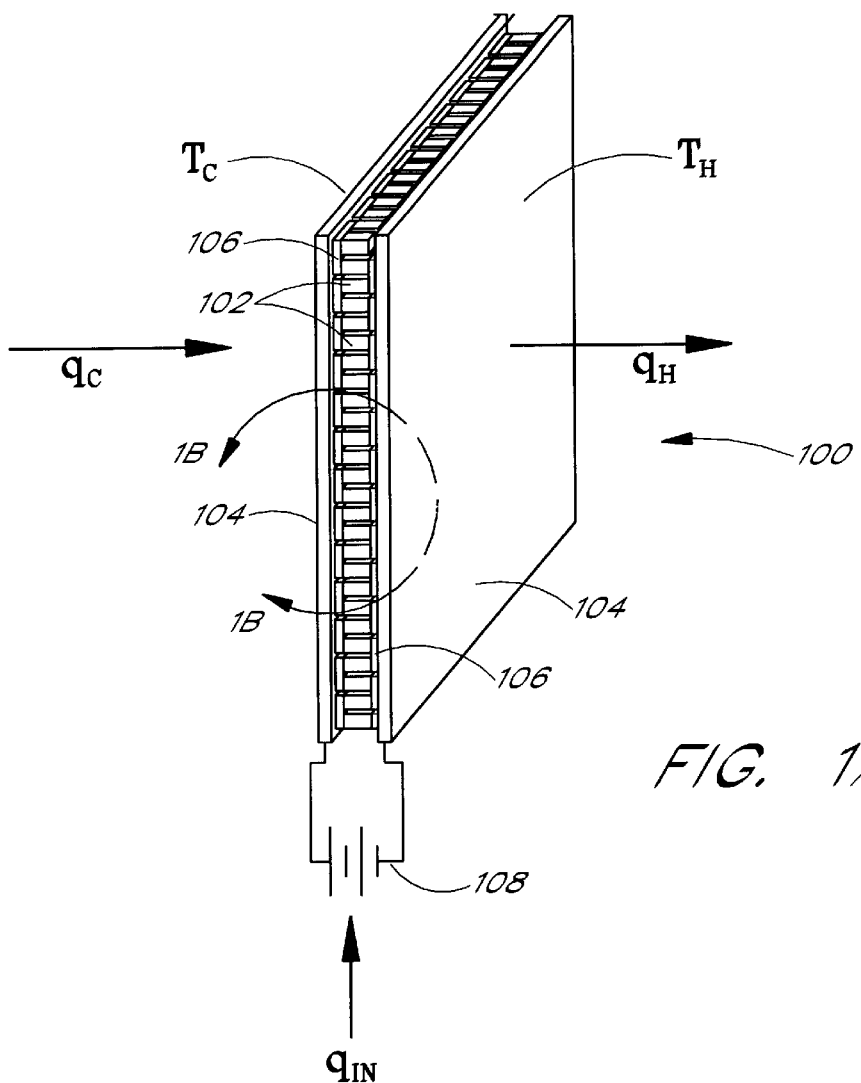
FIGS. 1A and 1B depict a conventional thermoelectric device.
Figure 1B:
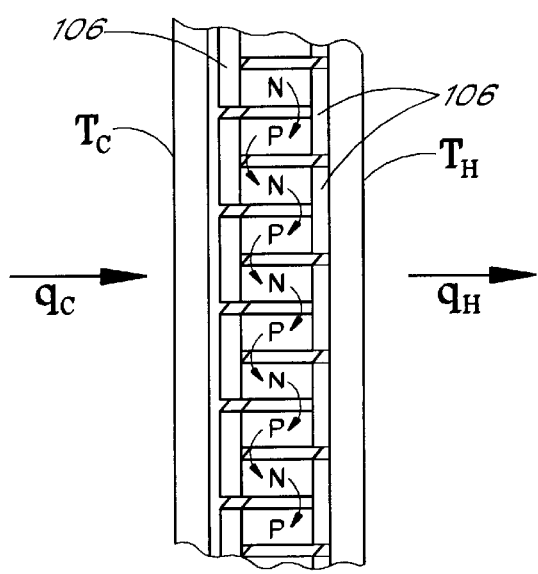
Figure 2:
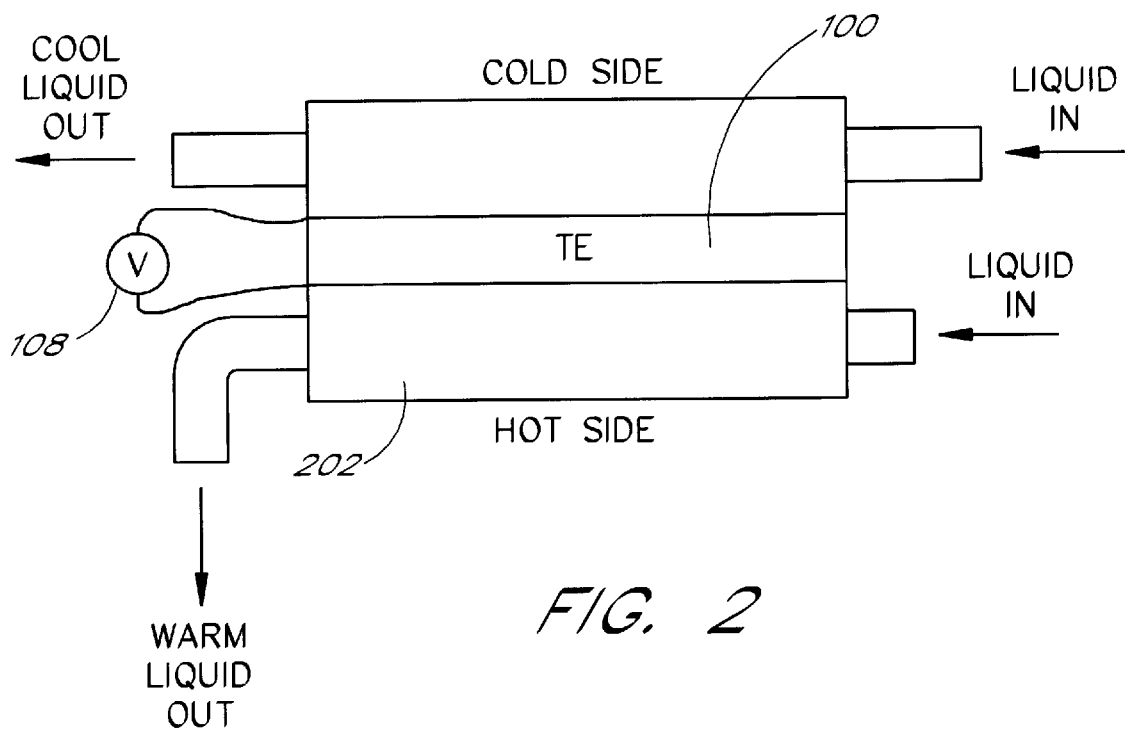
FIG. 2 depicts a conventional thermoelectric device in a conventional fluid heating or cooling application.
Figure 3:
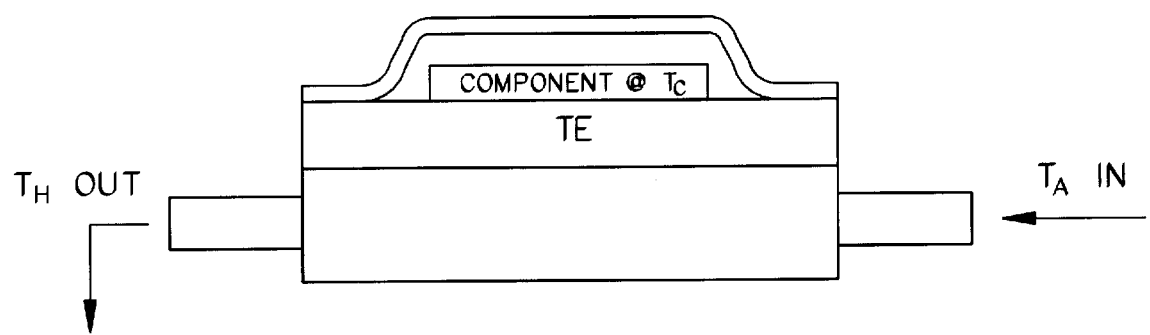
FIG. 3 depicts a conventional thermoelectric element for use in cooling a material or component.
Figure 4:
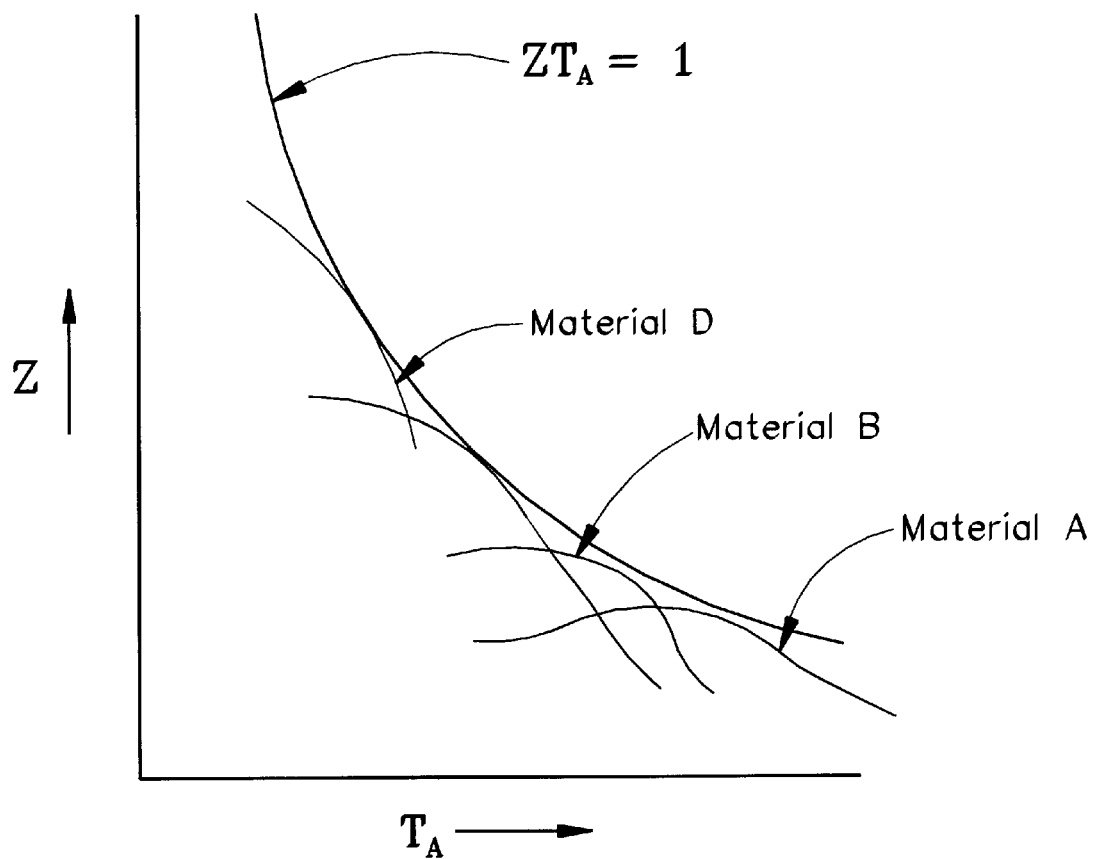
FIG. 4 depicts an efficiency measure of various thermoelectric materials.
Figure 5:
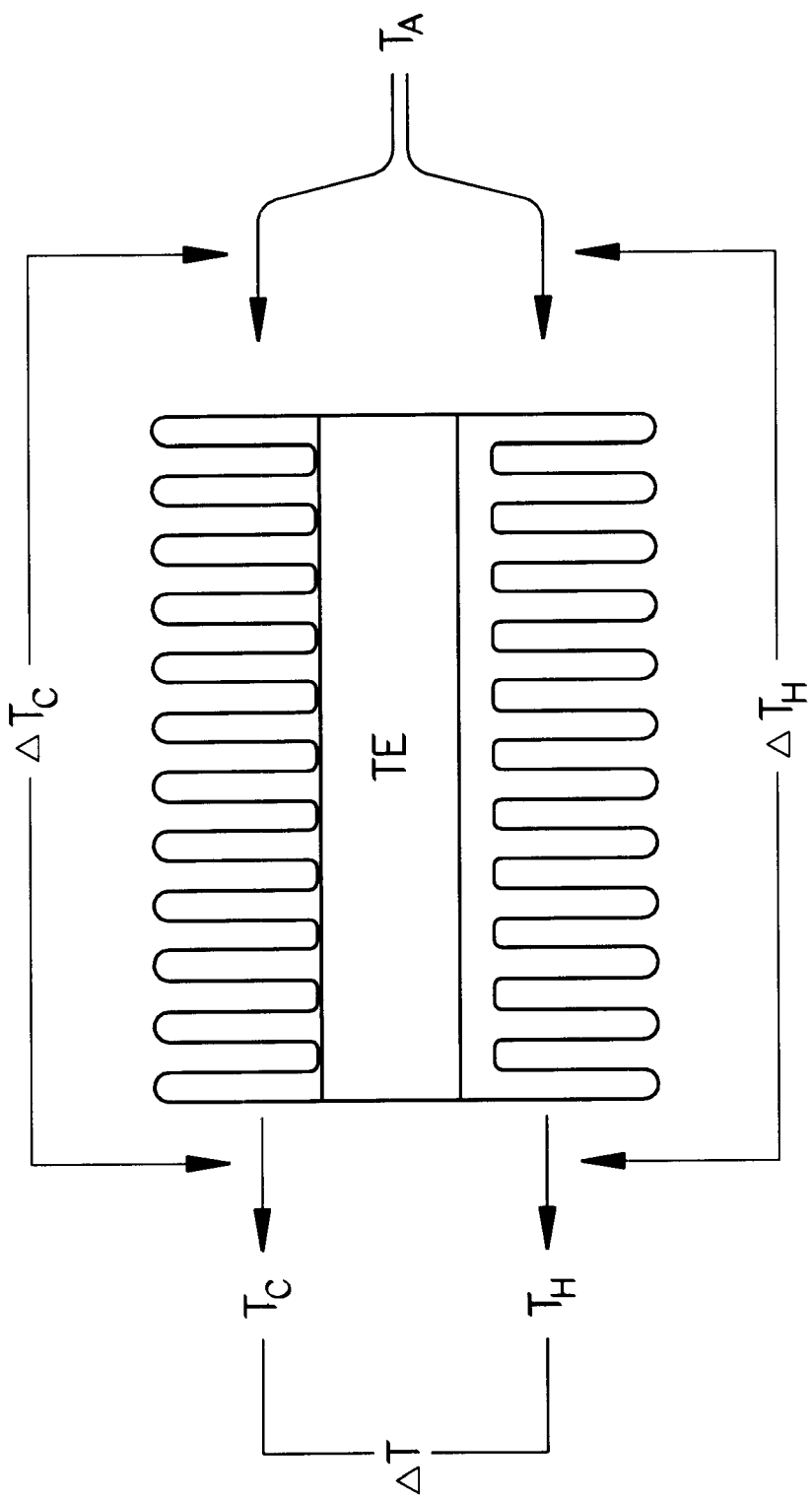
FIG. 5 illustrates a generalized conditions diagram of conventional thermoelectric devices.
Figure 6:
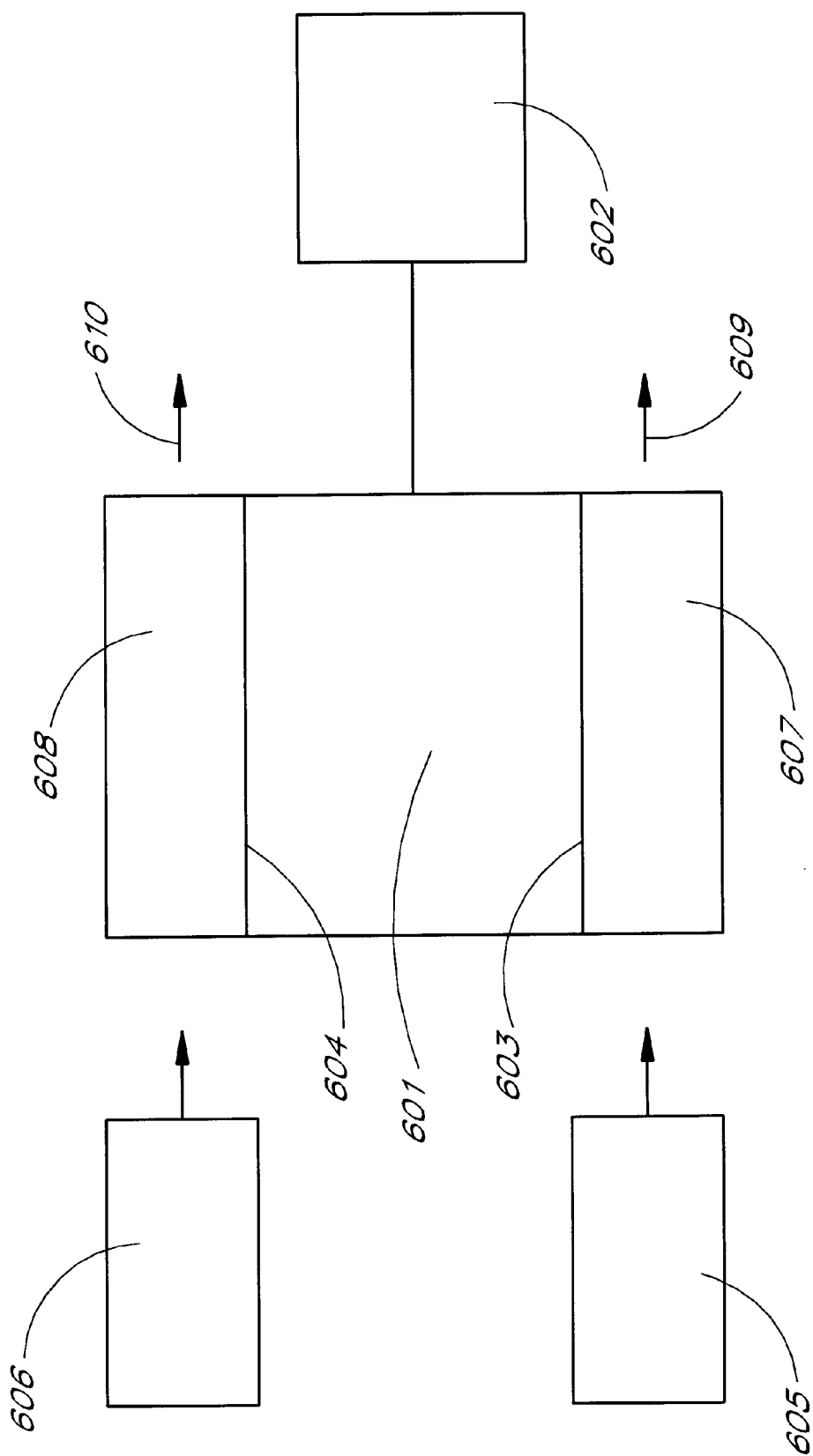
FIG. 6 illustrates a generalized block diagram of a thermoelectric system.

A generalized block diagram of an overall TE system 600 is shown in FIG. 6. A thermoelectric assembly 601 with hot side 603 and cool side 604 is electrically connected to a power source 602. The thermoelectric assembly 601 is in good thermal contact with a hot side heat exchanger 607 on the hot side 603 and with a cool side heat exchanger 608 on the cool side 604. Equipped with suitable ducts or pipes, sources of fluid 605 for the hot side 603 and 606 for the cool side 604, send their fluids through their respective heat exchangers 607 and 608. Heated fluid 609 and cooled fluid 610 exit the system at the right in the figure. For certain applications (with examples given below) one of the heat exchangers 607 or 608 may be replaced with a heat sink thereby eliminating the need for a fluid source or fluid on that side.

Figure 7A:
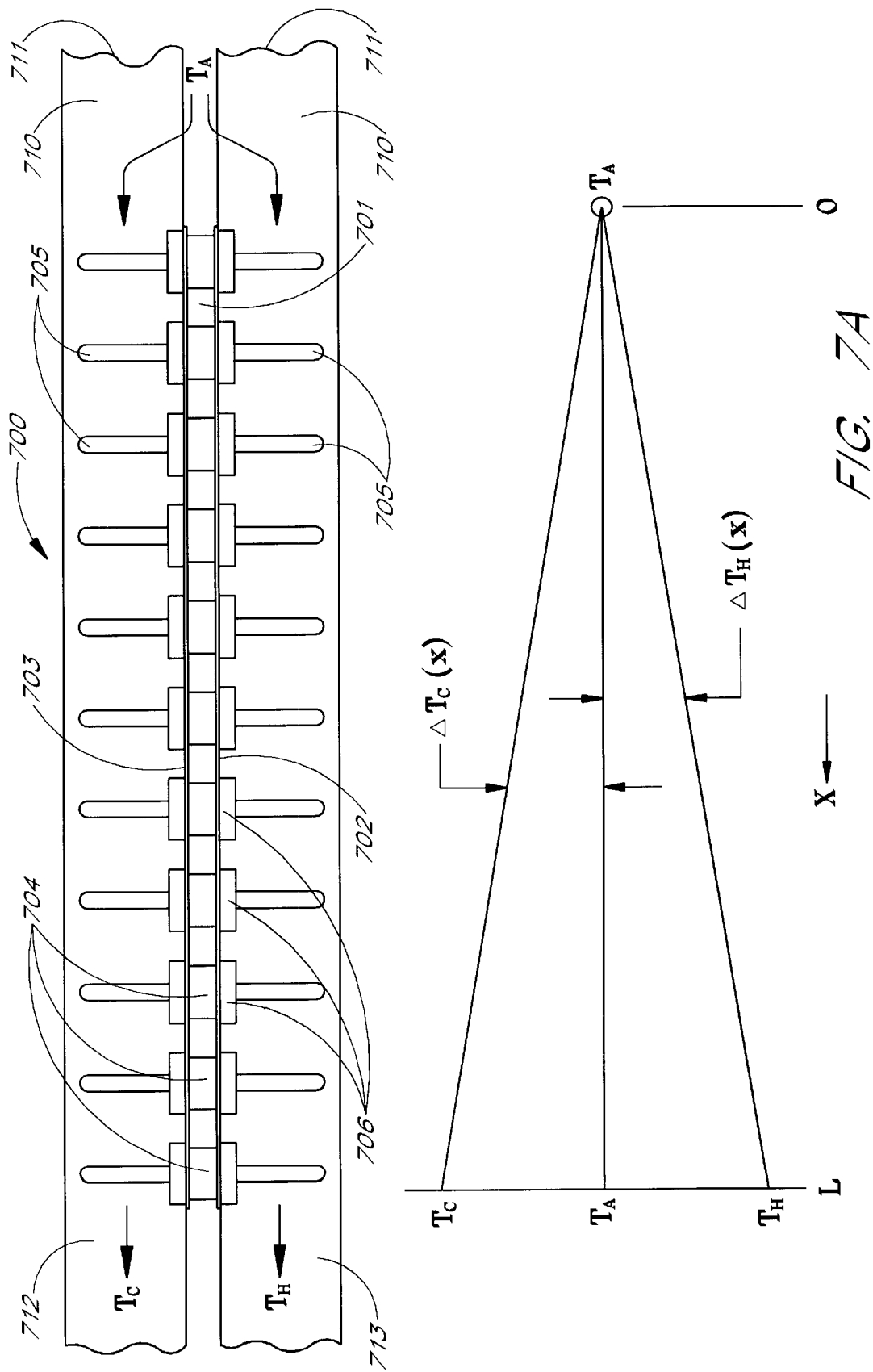
FIG. 7A depicts a first embodiment of a thermoelectric system in accordance with the present invention and its accompanying temperature profiles.

In general, and as described in further detail throughout this specification, the present invention relates to improving efficiency in thermoelectric systems by enhancing the thermoelectric system configuration to provide thermal isolation between elements or stages of a thermoelectric system along the array in the direction of flow for a medium to be heated or cooled. The bulk of the examples below are provided with a focus on cooling. However, the principles have application to heating, as well. One illustration of a first embodiment of a TE system 700 that substantially improves efficiency in accordance with the present invention is depicted in FIG. 7A. As illustrated, a TE element array 701 is constructed with a hot side substrate 702 and a cool side substrate 703 sandwiching a plurality of TE elements 704. A plurality of pins 705 are in good thermal contact with the TE elements 704, via both the hot side substrate 702 and the cool side substrate 703, and form heat exchangers for the TE system 700. As shown, the pins 705 have a form very similar to nails, with their heads 706 in good thermal contact with the TE elements 704 (hot and cold side). Preferably, the pins 705 are constructed of copper or other material having high thermal conductivity. Depending upon the application or the fluids to which heat transfer takes place, the pins 705 may be replaced with other heat exchanger configurations or geometries. Some such geometries are described below, such as heat pipes or fins. The heat exchanger should minimize heat transfer in the direction of fluid flow from pin to pin while maintaining good heat transfer from the TE elements 704 to the pins 705.

The hot side substrate 702 and the cool side substrate 703 are made from a material and/or constructed with a geometry that results in poor thermal conductivity along the length of the TE element array 701 in the direction of fluid flow. Preferably, the substrates 702 and 703 are thin so that their relatively poor thermal conductivity does not significantly impact the heat transfer from the TE elements 704 to the pins 705. The hot side substrate 702 and the cool side substrate 703 hold the TE element array 701 together and have electrically conductive portions that provide the required conventional electrical connections between the TE elements 704. Preferably, the material is selectively clad with copper or other electrically conductive cladding on both sides (for circuitry and for thermal attachment to the pins 705) with the copper having a thickness of about 0.050 mm. One preferred material is Kapton MT or other flexible, electrically insulative, printed circuit material. For Kapton MT, the thermal conductivity is about 0.5 W/mK and the thickness about 0.025 mm. Alternatively, the thermal conductivity could be substantially higher, for example, 20 W/mK, and still have a net positive effect on performance if the substrates 702 and 703 are thin enough (less than about 0.05 mm in one embodiment), or are shaped so as to provide thermal isolation in the direction of flow between adjacent pins. The goal of the construction of the TE system 700 is to keep the individual TE elements 704 substantially thermally isolated from each other in the direction of fluid flow, yet in good thermal contact with their respective heat exchanger parts.

One particular heat exchanger has been shown above. In order to capitalize on the efficiency gains available through the present invention, it is important that the heat exchangers be efficient at a local point level. In other words, it is important that at each point of the heat exchanger, the medium to be heated or cooled is brought to a temperature that is close to the temperature of the heat exchanger at that location. Differences in temperature between the medium to be cooled as it moves across the thermoelectric system and the heat exchanger at each location decrease the thermal efficiency. Thus, in accordance with the present invention, the thermoelectric elements are substantially thermally isolated in the direction of flow, the heat exchanger is also advantageously thermally coupled to the thermoelectric elements, but substantially thermally isolated in the direction of flow, and the heat exchanger is of a design, taking into account the nature of the moving medium, such that at any given location the temperature difference between the heat exchanger and the medium to be cooled or heated is small compared to the entire temperature difference from input to output.

In addition, the level of thermal isolation provided between thermoelectric elements depends upon trade-offs and the particular application. For example, thermal conduction is desirable to the heat exchanger, but thermal isolation is desirable along the substrate from thermoelectric element to thermoelectric element. Although better thermal isolation from element to element may improve efficiency, that efficiency can be offset by efficiency losses from poor local thermal conduction between the thermoelectric elements and the heat exchanger, or inefficient heat transfer between the heat exchanger and the medium to be cooled or heated. Therefore, each application requires balancing these three interrelated properties to achieve a practical, even if not always optimal, design for the particular application.

Figure 7B:
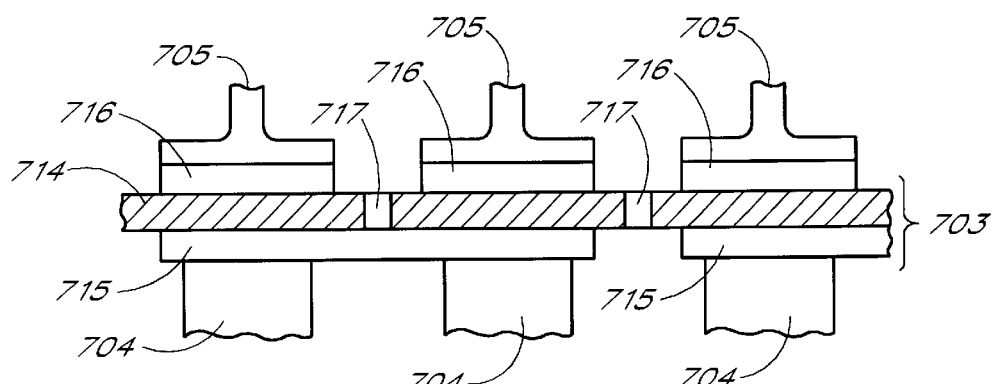
FIGS. 7B and 7C depict a more detailed illustration of the construction of the thermoelectric system of FIG. 7A.
Figure 7C:
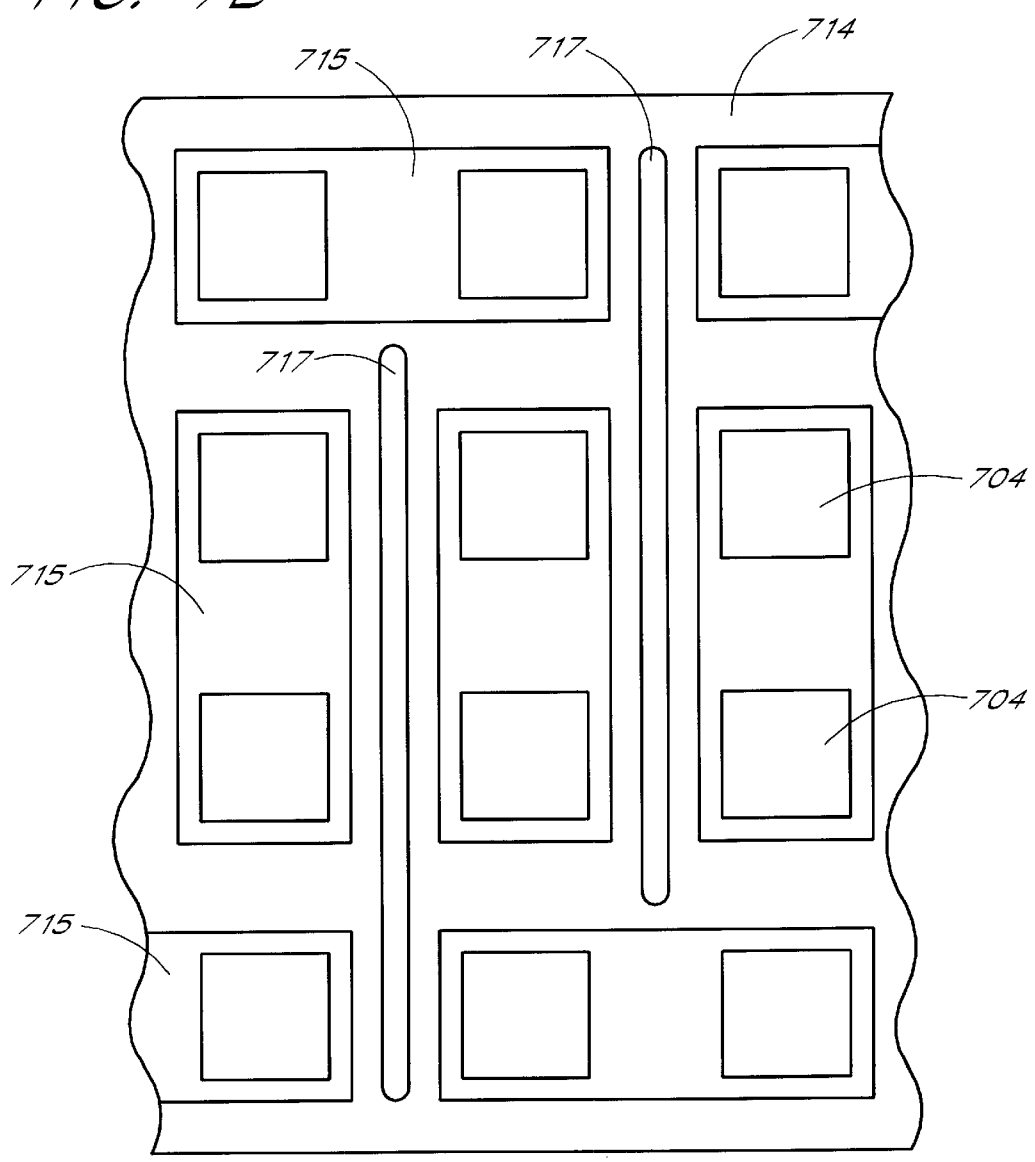

One possible construction for the TE system of FIG. 7A is shown in more detail in FIGS. 7B and 7C. FIG. 7B is an edge view of a portion of the TE system 700 of FIG. 7A. FIG. 7C is a view of the substrates normal to that of FIG. 7B as seen from the TE side viewed from the bottom of the cold side substrate. FIG. 7C shows one possible layout for the circuit traces for the array of TE elements 704 (for four elements wide). The number of elements along the width or length is chosen to match the application, and can be any number. The cold side substrate 703 is shown. The hot side substrate 702 is constructed in the same way in the present example. The substrate 703 is shown to be composed of an electrically insulating layer 714 that provides a structure on which the circuitry 715 used to connect the TE elements 704 together may be created. On the opposite side of the electrically insulating layer are metal pads 716 (FIG. 7B) with which the pins 705 are in good thermal contact. This contact may be achieved, for instance, by soldering or epoxy bonding. Other methods are also appropriate. The pads 716 need not be present if the pins are attached directly to the insulating layer 714 with good thermal contact and thermal energy transport properties. The pins can be extensions of the electrically insulating layer so that the pins or other part that serves the function are constructed as a single unit. Alternately, or in combination, the electrically insulating layer can be anisotropic so that its thermal conductivity is higher in the direction from a TE element to the pin and lower in the direction of flow. Another way to allow good heat transfer normal to its plane is to make the insulating layer 714 very thin. Although the insulating layer 714 is preferably a good thermal insulator in the direction of flow, the thermal insulation may be provided or further enhanced by gaps 717 in the insulating layer, thereby replacing the thermal conductivity of the insulating layer with that of air or another medium between the TE elements 704. The gaps 717 may be filled with highly thermally insulative material, in one embodiment.

The TE system 700 of FIG. 7A is configured for fluid flow from right to left. Fluid 710 at ambient temperature $T_A$ enters through suitable ducts 711 and is directed past the pins 705 which function as heat exchangers. The fluid exits at the left as cooled fluid 712 at a cooler temperature $T_C$ and heated fluid 713 at a higher temperature $T_H$. In this embodiment, the pins 705, including their heads 706, are not in good thermal contact with each other so that each pin is effectively thermally isolated from the others in the direction of fluid flow. Advantageously, the TE element array 701 and particularly the substrates 702, 703, are designed to be poor thermal conductors in the direction of fluid flow and provide good thermal conductance between the TE elements 704 and the pins 705.

The TE elements 704 may be conventional TE elements. However, a modification to the TE elements 704 of the TE element array 701 in the design of FIG. 7A can further improve efficiency. In one embodiment, the TE elements 704 are configured to have lower resistance on the right end in FIG. 7A with increasing resistance to the left, or vice versa, but with the direction of increasing resistance matching the direction of flow. Preferably, the resistance of the last TE element at the higher resistance end is about equal to that of conventional TE elements. Advantageously, the resistance, R, in the x direction (from right to left in FIG. 7A) is close to $$R(x) \approx R_O\left(\frac{x}{L}\right) \quad (16)$$

Where $R_o$=electrical resistance of an element in a conventional TE, and

R(x)=electrical resistance of the TE element at x.

for constant current throughout the TE.

Note that Equation (16) is not followed exactly since R(0) would be zero. Nevertheless, if R(0) is less than ½ $R_o$, substantial benefit will result (assuming the current, I, is constant throughout the TE). Further note at any point other than at the end where fluid exits, the efficiency is higher than that of a conventional device, since both ΔT(x) and R(x) are lower elsewhere, as shown with the following equations. The efficiency, or COP, at any point x can be approximated by:

$$\beta_P(x) = \frac{\alpha I T_c - \frac{1}{2} I R(x) - K \Delta T(x)}{\alpha I \Delta T(x) + I^2 R(x)} \quad (17)$$

where;

R(x)=electrical resistance of the TE element at x (18)

ΔT(x)=ΔT at x (19)

$\beta_P$=COP for this geometry (20)

The resistance R(x) is less than $R_o$ so $I^2R(x)$ is smaller than $I^2R_o$ and ΔT(x) is smaller than ΔT(L). At every point x other than at L, R(x) advantageously is less than $R_o$, and ΔT(x) is less than ΔT(L) so the numerator has its lowest value at L. For the same reason, advantageously the denominator is less at x, so β(x) is greater than β(L) for all x less than L. The integral of β(x) from 0 to L is the COP for the device, which by the above is greater than the COP if β effectively were constant because of fluid flow patterns or thermal conductivity in the direction of flow as it is in conventional TE systems. In summary, the TE system of FIG. 7A provides increased efficiency over conventional TE systems because the average temperature differential between hot side 702 and the cold side 703 (ΔT) across the TE system 700 is less than with a conventional system, thus increasing its thermodynamic efficiency. This is depicted in the temperature profile graph in FIG. 7A. Detailed calculations for COP indicate that $\beta_P$ can be, preferably, 50% to 150% greater than the COP for a comparable conventional device.

Figure 7D:
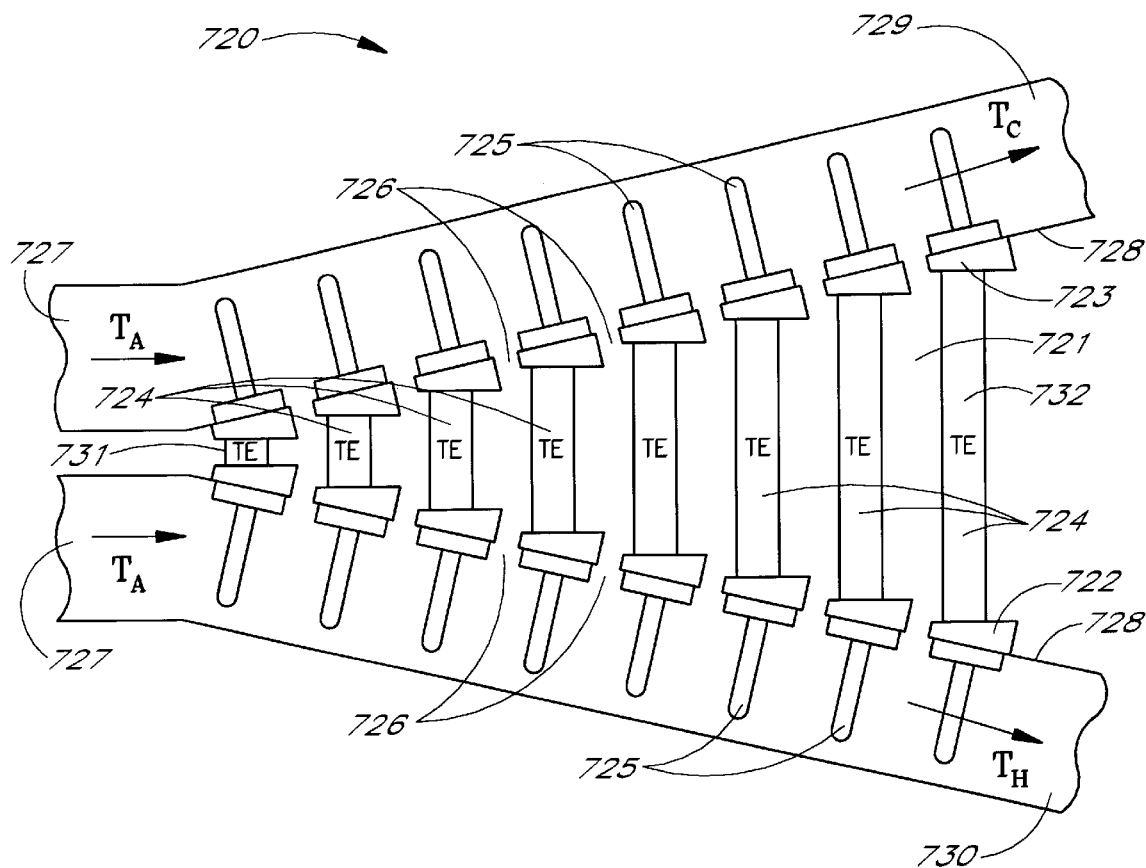
FIGS. 7D and 7E depict alternative embodiments of the thermoelectric system of FIG. 7A, including additional enhancements according to the present invention.
Figure 7D:
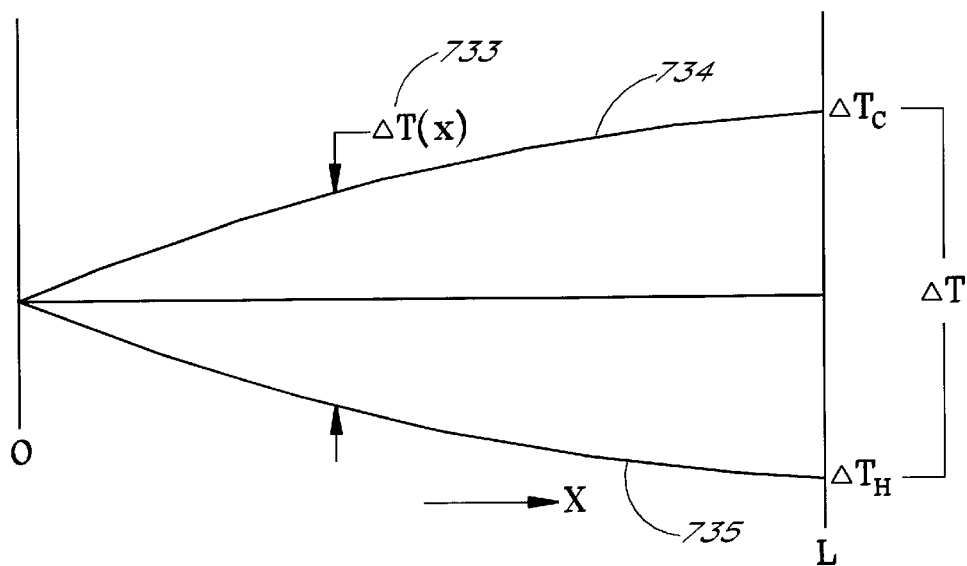

One example of a TE system configuration 720 for achieving the increasing resistance along the length of the device is shown in FIG. 7D. In this configuration, once again, a TE element array 721 is constructed with a hot side substrate 722 and a cool side substrate 723 sandwiching a plurality of TE elements 724. A plurality of pins 725 are in good thermal contact with the TE elements 724, via both the hot side substrate 722 and the cool side substrate 723, and form heat exchangers for the TE system 720. Again, the thermal conductivity along the length of the TE element array 721 preferably is minimized, shown by example in FIG. 7C as gaps 726 in the substrates 722 and 723. The flow is from left to right in FIG. 7C with fluid 727 at ambient temperature $T_A$ entering through suitable ducts 728 and flowing past the pins 725 which function as heat exchangers. The fluid exits at the right as cooled fluid 729 at a temperature $T_C$, and heated fluid 730 at a temperature $T_H$. In this example, the variation in resistance of the TE elements 724 is achieved by a variation in their lengths with the lowest resistance and shortest TE elements 731 advantageously located at the inlet 736 and the highest resistance and longest TE element 732 located at the outlet end 737 of TE system 720. The resistance of the TE elements 724, and hence their lengths, are advantageously proportional to ΔT(x) 733 of the two curves 734 and 735 of the temperature profile shown at the bottom of FIG. 7C. Note that these two curves 734 and 735 are not straight lines as they were in FIG. 7A. The functional form of the ΔT(x) curve is controlled by R(x) and the current and other factors that influence heating and cooling of the fluid. Whatever the functional form of the ΔT(x) curve, the resistance of the elements preferably follow its general shape.

Figure 7E:
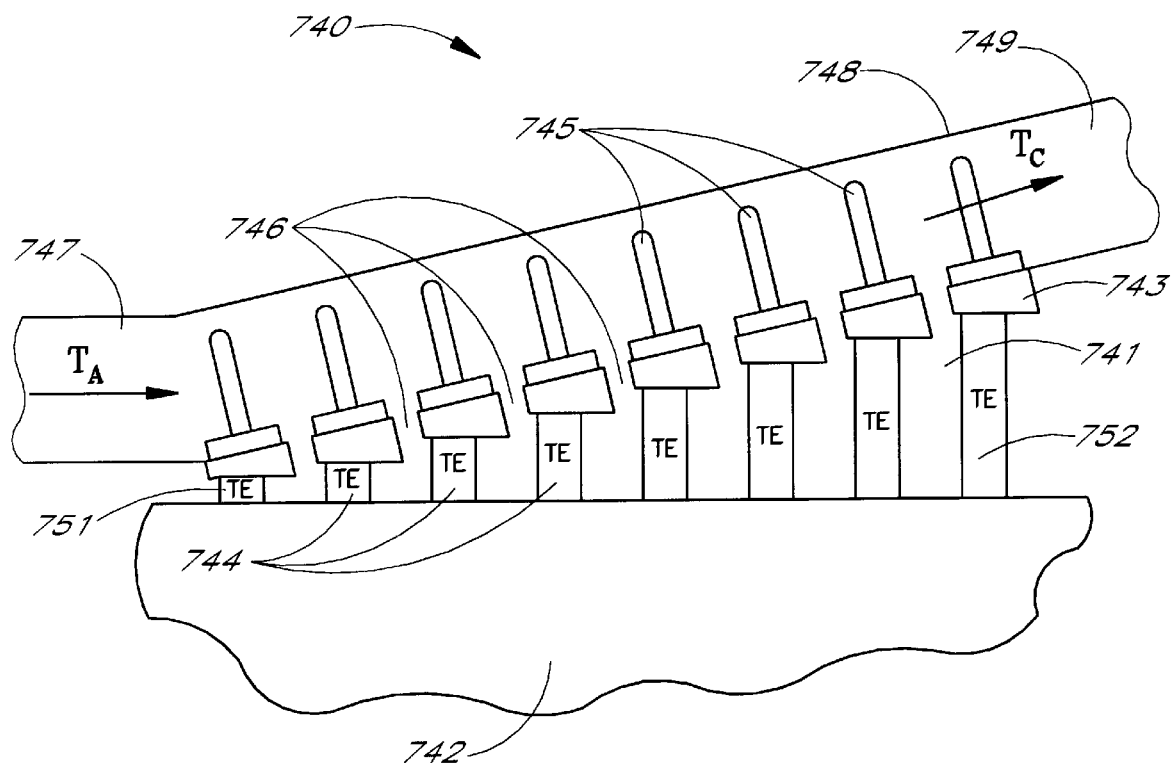
Figure 7E:
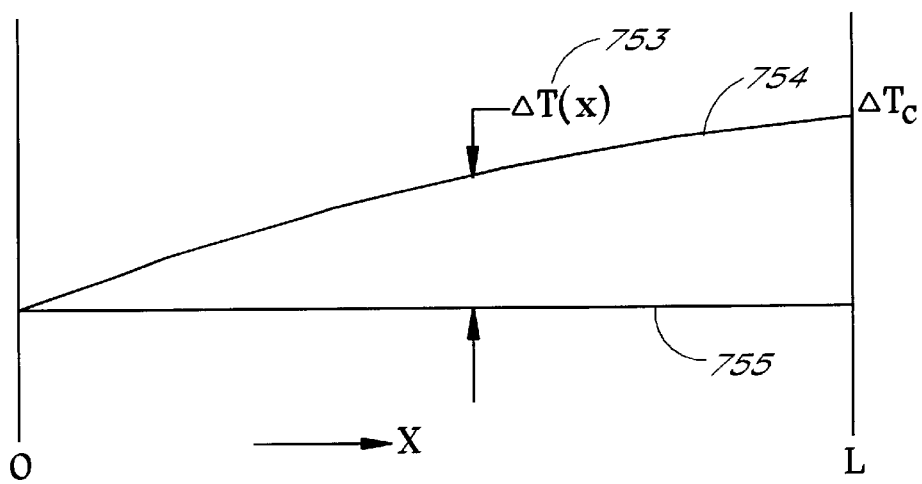

Yet another example of a TE system 740 in accordance with the present invention is shown in FIG. 7E. This embodiment is the same as that shown in FIG. 7D, except that the hot side substrate 742 is a heat exchanger which, from the standpoint of the heat produced by the TE system 740 is a heat sink. Preferably, from the standpoint of the heat produced by the TE system 740, the heat sink is essentially infinite. In this configuration, a TE element array 741 is constructed with the hot side substrate 742 and a cool side substrate 743 sandwiching a plurality of TE elements 744. A plurality of pins 745 are in good thermal contact with the TE elements 744, via the cool side substrate 743, and form the cool side heat exchanger for the TE system 740. The hot and cold sides may be reversed by reversing the electrical current flow direction if the application demands heating rather than cooling. Again, the thermal conductivity along the length of the TE element array 741 is minimized on the cool side substrate 743. As in FIG. 7D, thermal isolation may be enhanced or obtained by gaps 746 in the substrate 743. As in the previous examples, the gaps 746 may be filled with air or other material of low thermal conductivity. The flow is from left to right in FIG. 7E with fluid 747 at ambient temperature $T_A$ entering through a suitable duct 748 and flowing past the pins 745 which function as heat exchangers. The fluid exits at the right as cooled fluid 749 at a cooler temperature $T_C$. Variation in resistance of the TE elements 744 is achieved advantageously by a variation in their lengths with the lowest resistance and shortest TE element 751 located at the inlet and the highest resistance and longest TE element 752 located at the outlet end of TE system 740. The resistance of the TE elements 744, and hence their lengths in this example, are shown as being substantially proportional to $\Delta T(x)$ 753 of the two curves 754 and 755 of the temperature profile shown at the bottom of FIG. 7C. Curve 755 is a straight line because, in this example, the hot side substrate 742 is effectively an infinite heat sink. Such a heat sink 742 may be the wall of a vessel wherein the other side of which is in contact with a large amount of fluid maintained at a constant temperature by an external means.

Figure 8:
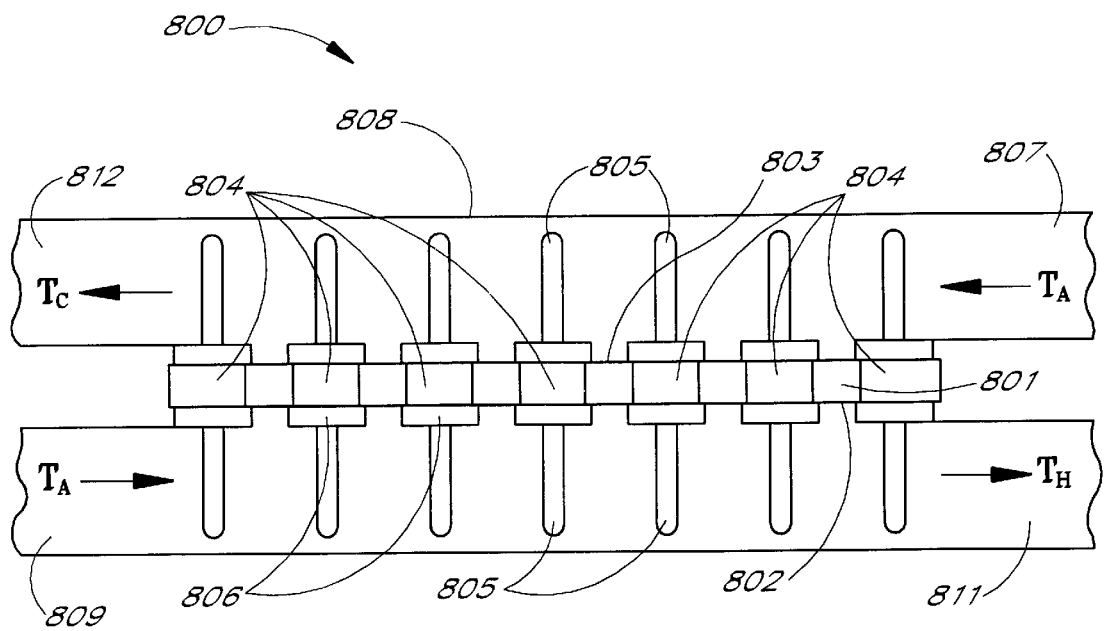
FIG. 8 depicts a thermoelectric system in accordance with the present invention for flow from opposite sides.
Figure 8:
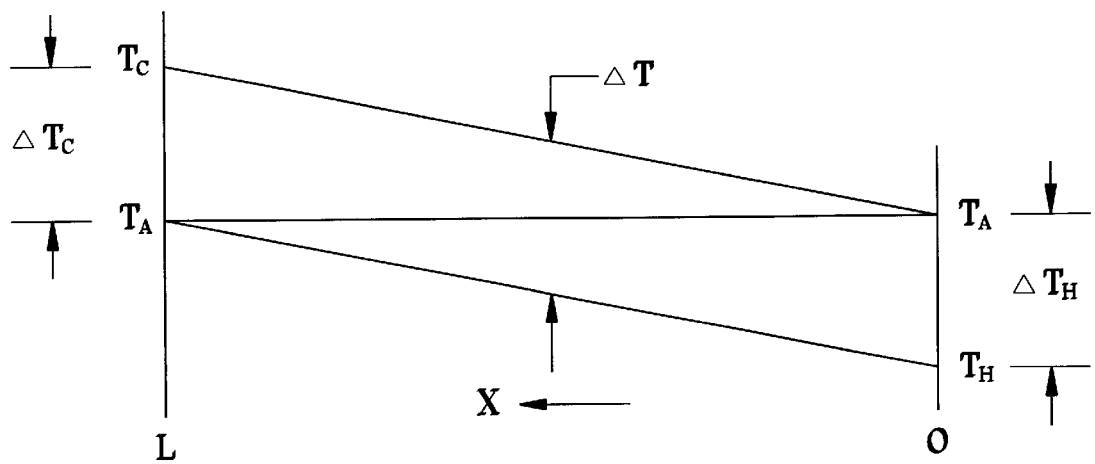

Yet another configuration of a TE system 800 that employs thermal isolation of TE elements in accordance with the present invention is shown in FIG. 8. As with FIG. 7A, a TE element array 801 is constructed with a hot side substrate 702, a cool side substrate 703, a plurality of TE elements 704, and a plurality of pins 705 in good thermal contact with the TE elements 704. In this embodiment, thermal isolation in the direction of flow is employed as before, but a fluid 807 entering via the cold side duct 808 at ambient temperature $T_A$ for flow along the cool side and a fluid 809 entering the hot side duct 810 at ambient temperature $T_A$ for flow along the hot side originate from opposite ends of the TE system 800. The fluids 807, 809 flow across the pins 705 to exit at the opposite ends of their respective ducts 808, 810. The resulting heated fluid 811 exits from one end at temperature $T_H$, and the resulting cooled fluid 812 at temperature $T_C$ exits from the other end, both after flowing across the respective hot or cool sides of the TE system 800.

A particular case of interest is where $\Delta T(x)$ and $R(x)$ are constant because this tends to be a practical case that balances thermodynamic efficiency considerations, ease of manufacture, and the need to reduce waste side (hot side) flow. If;

$$\Delta T(x) = \Delta T_c = \Delta T_h = \Delta T \tag{21}$$

then approximately;

$$\beta_c = \frac{\alpha I T_c - \frac{1}{2} I^2 R - K \Delta T}{\alpha I \Delta T + I^2 R} \tag{22}$$

$$\beta_c = \text{COP for this geometry} \tag{23}$$

If this approximate result is compared with the related equation for COP for a conventional device with $\Delta T_h = \Delta T_c$, then the present system will be more efficient, since in (23) $\Delta T = \Delta T_c$, while in a conventional device, $$\Delta T = \Delta T_c + \Delta T_h \tag{24}$$

and for the assumption that $\Delta T_c = \Delta T_h$ $$\Delta T = 2 \Delta T_c \tag{25}$$

Thus from (22) $\beta_c$ will be greater than $\beta$ (Equation 14), as an example, for the following design parameters;

$\alpha = 10^{-1}$ V/K
I=3 A
R=2 Ω
K=2 W/mK
$T_c$=280 C
$\Delta T_c = \Delta T_h$=10 C
Equation (22) yields;

$$\beta_c = 2.11 \tag{26}$$

and for the conventional design with $\Delta T = 2\Delta T_c$;

$$\beta = 1.40 \tag{27}$$

Further, the fraction of the total flow on the waste side 809, 811 is reduced since the efficiency of the system is greater, and so relatively less heat from $q_{in}$ is rejected from the waste side 809, 811, in the present design.

The temperature profile for the fluid for the TE system 800 of FIG. 8A is illustrated in the lower portion of the figure.

All of the above geometries provide variations of the invention relating to isolating TE elements thermally in the direction of fluid flow. The benefits of the isolated element geometries disclosed above include:

(1) The thermodynamic efficiency can be substantially higher;
(2) The fluid flow fraction on the main side (the side of interest in the particular application, cool or hot) can be substantially greater.

Although particular embodiments are disclosed above, any configuration which causes or provides the thermal isolation efficiencies explained above are within the scope of the invention. In addition, enhancements such as decreased resistance are added improvements, on top of the isolation efficiencies obtained through the embodiments disclosed above.

FIGS. 7A–E and FIG. 8 have illustrated the important feature of thermal isolation of TE elements in the direction of flow along with the enhancement of performance due to the increase in resistance of the elements in the direction of flow. FIGS. 9A through 9E show other examples of embodiments incorporating these features but utilizing different geometries for the heat exchangers and the TE elements.

FIGS. 9A and 9B show such an embodiment of a TE system 900 in which the heat exchanger has fins rather than pins. FIG. 9A is a side view and FIG. 9B is an end view. As illustrated, a TE element array 901 is constructed with a hot side substrate 902 and a cool side substrate 903 sandwiching a plurality of TE elements 904. A plurality of heat exchangers 905 are in good thermal contact with the TE elements 904, via both the hot side substrate 902 and the cool side substrate 903. Electrical connection from element to element is made via circuitry 908 preferably bonded to the substrates 902 and 903 and to the TE elements 904. As shown, the heat exchangers 905 consist of a corrugation of thin metal fins 906 which are in good thermal contact with the TE elements 904 (hot and cold side) through the substrates 902 and 903. Preferably, the heat exchangers 905 are constructed of copper or other material having high thermal conductivity and having as flat a bottom edge 907 as possible to provide maximum surface area in contact with the substrates 902 and 903. The thermal conductivity in the direction of flow (normal to the plane of FIG. 9B) is minimized in this embodiment by having separate heat exchangers 905 for each row of TE elements 904 separated by gaps 909.

Figure 9C:
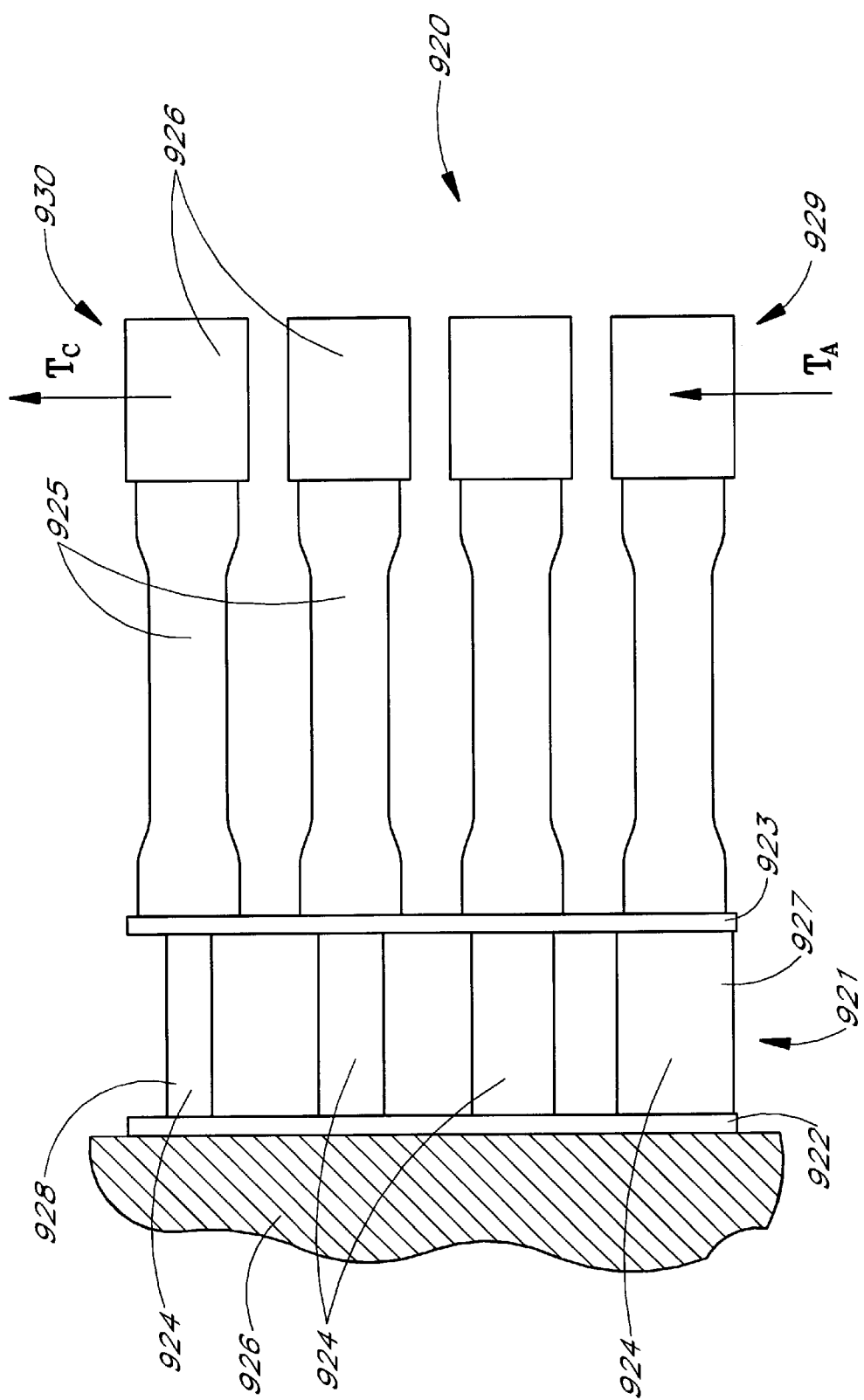

Shown in FIG. 9C is another embodiment of a TE system 920 depicting the use of heat pipes 925 and a heat sink 926. A TE element array 921 is constructed with a hot side substrate 922 and a cool side substrate 923 sandwiching a plurality of TE elements 924. In this configuration, the TE system is configured for cooling. Once again, the cold side substrate 923 has poor thermal conductivity in the direction of flow. A plurality of heat pipes 925 are in good thermal contact with the TE elements 924 via the cool side substrate 923, and transfer heat between the cool side substrate 923 and the heat exchangers 926 shown as an example, at the ends of the heat pipes 925. In this embodiment, the direction of flow is from bottom to top in FIG. 9C. In the TE system 920 depicted in FIG. 9C, the hot side substrate 922 is in good thermal contact with a heat sink 926. Advantageously, from the standpoint of the heat produced by the TE system 920, the heat sink 926 is effectively infinite. The TE system 920 as shown can also employ the change in resistance of the TE elements 924 along the direction of flow. The lowest resistance element 927 is at the flow inlet side 929 and the highest resistance element 928 is at the flow outlet side 930. The resistance in this case is inversely proportional to the cross-sectional area of the TE elements 924 with the decrease in cross-sectional area proceeding from the inlet 929 to the outlet 930 thereby causing the resistance to increase in the opposite direction. The TE elements 924 are electrically connected with circuitry as described above, but not shown in this figure for clarity.

Yet another example of an isolated element TE system 940 for cooling is shown in FIGS. 9D and 9E. FIG. 9D is an end view and FIG. 9E is a side view. The construction depicted shows one preferred way to make a finned heat exchanger 945. As shown, the TE element array 941 is constructed with a hot side substrate 942 and a cold side substrate 943. At least the cold side substrate 943 has low thermal conductivity in the direction of flow. These substrates 942 and 943 sandwich a plurality of TE elements 944 electrically connected together with circuitry 949 as described above. A single fin array 945 is in good thermal contact with the TE elements 944 via the cold side substrate 943. Despite being a single piece, thermal conductivity in the direction of flow through the fin array 945 is reduced by the gaps 946 between adjacent fin sections. Tabs 947 hold the entire array together. Advantageously, these tabs 947 are small enough in comparison to the gaps 946, that they do not significantly increase heat transfer between adjacent fin sections. The enhancement that can be obtained through TE element resistance change is depicted with increasing lengths of the TE elements 944 as flow proceeds from the inlet 950 to the outlet 951 in FIG. 9E. As with previous embodiments, the varying resistance could be obtained in other ways, such as varying the cross-section of the TE elements 944, varying the TE element material resistivity, or combinations of varying the length, cross-section, and resistivity of the TE elements. Finally, a heat sink 948 is in good thermal contact with the hot side substrate 942. This heat sink is preferably of the type described in FIGS. 7E and 9C.

Figure 10:
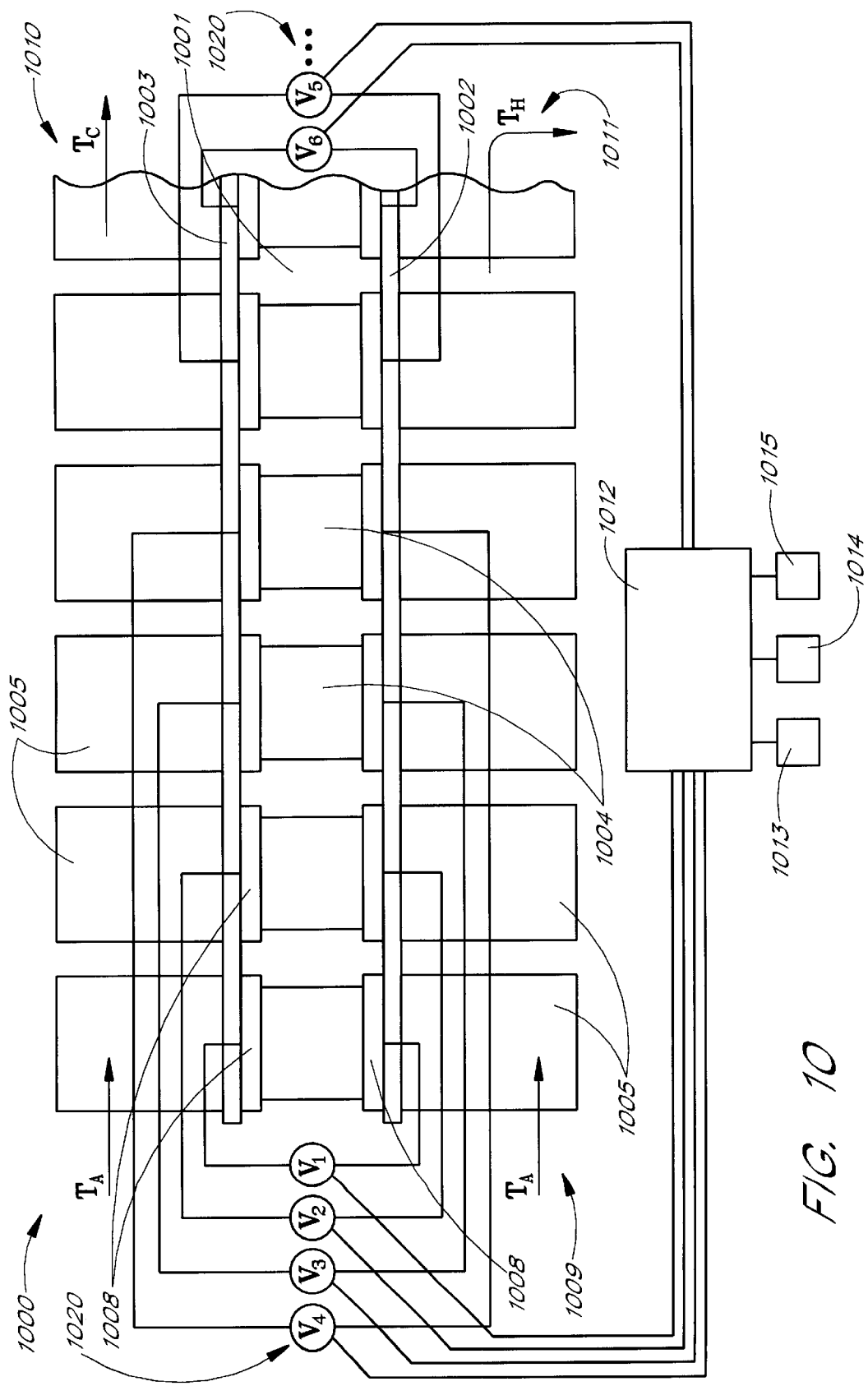
FIG. 10 shows another embodiment of a thermoelectric system in accordance with the present invention using a control system, which varies the current through various portions of the system.

FIG. 10 shows a another embodiment that achieves a performance enhancement similar to that previously described due to a change in the resistance (and isolated elements) of the TE elements in the direction of flow. In this embodiment, the resistances of the TE elements are the same throughout the device but the voltages applied to the elements are varied along the direction of flow.

In FIG. 10, an example of a TE system 1000 is shown in which a TE element array 1001 is constructed with a hot side substrate 1002 and a cool side substrate 1003 sandwiching a plurality of TE elements 1004. A plurality of heat exchangers 1005 are in good thermal contact with the TE elements 1004, via both the hot side substrate 1002 and the cool side substrate 1003. The heat exchangers 1005 and the substrates 1002, 1003 can have any of the configurations depicted in the previous embodiments. The heat exchangers 1005, like those described in FIGS. 9A and 9B, are in good thermal contact with TE elements 1004 (hot side 1011 and cold side 1010) through the substrates 1002 and 1003. As shown in FIG. 10, the flow on both the hot side 1011 and the cold side 1010 is from left to right. Fluid 1009 enters at the left at ambient temperature $T_A$ and passes over or through the heat exchangers 1008 gradually changing in temperature throughout the length of the TE system 1000 until it exits at the right as fluid 1010 at a reduced temperature $T_C$ on the cold side and as fluid 1011 at a raised temperature $T_H$ on the hot side. Electrical connection from TE element to TE element is made via the circuitry 1008 connected to the substrates 1002 and 1003 and to the TE elements 1004. Rather than the interconnection circuitry on the substrates as in the previous embodiments, the substrate circuitry 1008 does not connect all the TE elements 1004 in series.

In FIG. 10, the circuitry 1008 is constructed so that individual TE elements 1004 or rows of TE elements 1004 normal to the direction of flow can have differing sources of voltage and therefore can have different currents running through the elements or rows. Accordingly, as depicted in FIG. 10, various control voltages 1020 can be provided for various segments or sections of the thermoelectric array 1001. In one embodiment, a plurality of sensors 1013, 1014, 1015 are coupled to a control system 1012 are provided to monitor the TE system. The control system 1012 is coupled to the plurality of control voltages 1020 to control the currents provided to the different elements or rows in the TE array 1001. The voltages along the length of the TE system 1000 may be varied via the control system 1012 depending upon external conditions or upon conditions within the system itself. These conditions, some or all of which may be present, include external temperature or flow, internal temperature or flow, and user selectable inputs to manually control the desired amount of heating or cooling by particular TE elements or rows of TE elements.

The conditions, such as external temperature or flow, internal temperature or flow, can be monitored through sensors such as the sensors 1013, 1014. The user selectable inputs can be provided through knobs, dials, push buttons, or other programmable means of the control system 1012. For example, a user interface 1015 can be provided for the user selectable or configurable inputs. Advantageously, through the user interface 1015, the conditions monitored or the trip levels for the conditions monitored via the sensors 1013 and 1014 can be modified to customize the TE system for its particular application or the particular condition to which it is subjected at any given time. The sensors 1013, 1014, and 1015 are monitored by control circuitry 1012 which, using hard wired or software relationships (whose nature depends upon the application), causes the voltages applied to vary in accordance with the sensor inputs.

An advantage of this type of system is that it permits the thermal power generated by the TE elements 1004 to be varied as desired to achieve improvement in efficiency. For example, this allows adjustments to the current through the TE elements 1004 as flow conditions change from time to time. The ability through this embodiment to obtain efficiency gains can be understood with Equation 32 which gives the current for optimum efficiency $I_{opt}(x)$ for the TE system at any point x along it length.

$$I_{opt}(x) = \frac{\alpha \Delta T(x)}{R(\sqrt{1+ZT} - 1)} \qquad (28)$$

In Equation (28) the parameters α and Z are properties of the TE material. R is the resistance of the TE elements 1004 and for discussion of the embodiment of FIG. 10 can be considered constant throughout the TE system 1000. Therefore Equation (28) shows that for optimum efficiency, $I_{opt}$ is proportional to ΔT. To achieve $I_{opt}$, it is necessary to make the voltage across elements at position x to be the product of $I_{opt}(x)$ an R. Since in the example ΔT increases from zero at the left to its maximum value at the right, the leftmost elements should be powered with as low a voltage as practical, and increase to a maximum value at the exit 1010 and 1011. Thus in FIG. 10, $0 \approx V_1 < V_2 < V_3 \ldots < V_n$. Advantageously, the variation of voltage with position x along the direction of flow should approximate;

$$V(x) = \frac{\alpha \Delta T(x)}{(\sqrt{1+ZT} - 1)} \qquad (29)$$

Figure 11:
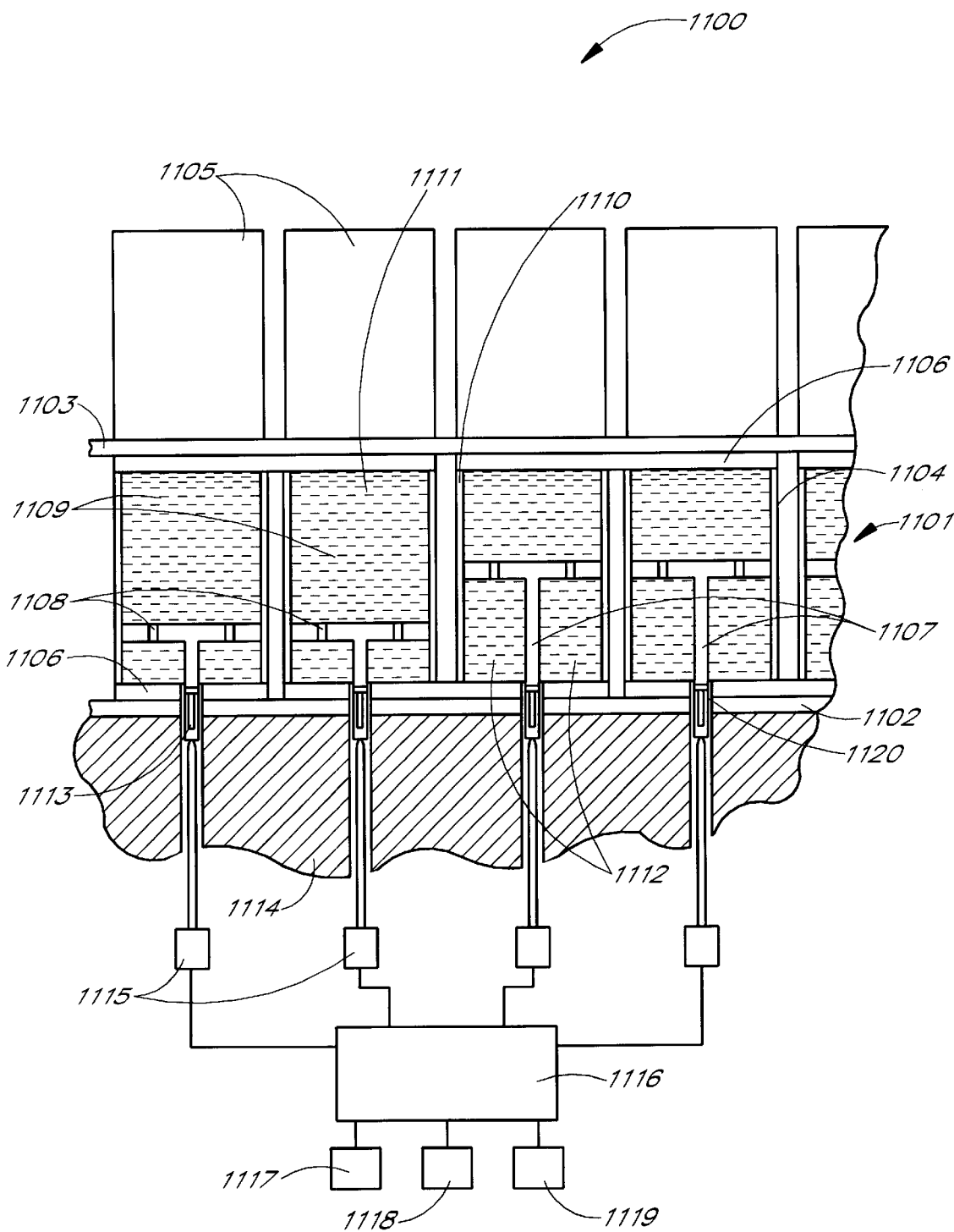
FIG. 11 illustrates yet another embodiment of a thermoelectric system in accordance with one aspect of the present invention, in which a resistance change in the thermoelectric elements is achieved by mechanical means.

FIG. 11 presents yet another example of a TE system 1100 in accordance with one aspect of the present invention in which the performance enhancement due to resistance change is achieved by mechanical means. A TE element array 1101 is constructed with a hot side substrate 1102 and a cold side substrate 1103 sandwiching a plurality of TE elements 1104. In this embodiment, the TE elements 1104 are made from a liquid TE material 1109 contained within tubes 1110 whose ends are closed by a combination of interconnection circuitry 1108 and hot and cold side substrates 1102 and 1103. One possible example of liquid TE materials are mixtures of Thallium and Tellurium (p-type) at temperatures (above room temperature) where it becomes liquid, and a mixture of mercury/rubidium (n-type). Another example P-type Bismuth and Telluride sluried in mercury and N-type bismuth and telluride sluried in mercury. Some such materials are described by A. F. Ioffe, in Semiconductor Thermal Elements, and Thermoelectric Cooling, Infosearch, London, 1957.

A plurality of heat exchangers 1105 are in good thermal contact with the TE elements 1104, via the cold side substrate 1103. As shown in this example, the heat exchangers 1105 are like those described in FIGS. 9A and 9B and are in good thermal contact with TE elements 1104 via the cold side substrate 1103. As described above, the heat exchangers may be of a number of different types, such as the nail, fins, or heat pipes, or any of a number of other heat exchanger types. As before, the TE elements 1104 are substantially or at least significantly thermally isolated in the direction of fluid flow on the cold side 1103. A heat sink 1114 (from the standpoint of the TE system 1100 being effectively infinite) is in good thermal contact with the TE elements 1104 via the hot side substrate 1102. In this embodiment, a piston 1107 is provided for at least some of and possibly all of the TE elements 1104. The pistons have holes 1108 and are coupled to actuators 1115 which are coupled to a system controller 1116. The system controller 1116 is coupled to a plurality of sensors 1117, 1118 and 1119. For example, the sensors may be external sensors 1117, internal sensors 1118, and user controlled or user input devices 1119. Advantageously, the system controller 1116 provides hardware or microprocessor-based computer control for the actuators 1115 and includes power source or drivers for the actuators 1115 to provide sufficient current required by the actuators 1115. Electrical connection from TE element to TE element is made via circuitry 1106 connected to the substrates 1102 and 1103 and is in contact with a surface of TE elements 1104 and also with the pistons 1107. Electrical contact from the pistons 1107 to the hot side substrate 1102 is achieved with sliding contacts 1113. The holes 1108 in the pistons 1107 allow the liquid TE material 1109 to pass through the holes 1108 as the pistons move. At any position, the pistons 1107 divide the liquid TE material into forward sections 1111 and aft sections 1112. In this embodiment, the pistons 1107 are made from an electrically conductive material whose conductivity is substantially greater than that of the liquid TE material 1109. When the pistons 1107 are not fully against the hot side circuitry 1106 so that aft section 1112 is not of zero volume, a portion of the liquid TE material 1109 is effectively shorted by the pistons 1107, thereby reducing the resistance of the TE elements 1104 to some value less than their maximum resistances. Thus, the position of the pistons 1107 is adjustable to vary the resistances of the TE elements 1104 along the length of the TE system 1100 in accordance with a fixed or time-varying scheme. The control scheme can be similar to that described for FIG. 10, except that advantageously, instead of varying the voltages applied to the TE elements 1104, the position of the pistons 1107 is varied by use of the actuators 1115 controlled by the controller 1116 or other power source in response to changes in inputs from external sensors 1117, internal sensors 1118, user input sensors 1119, or other signaling devices.

Figure 12:
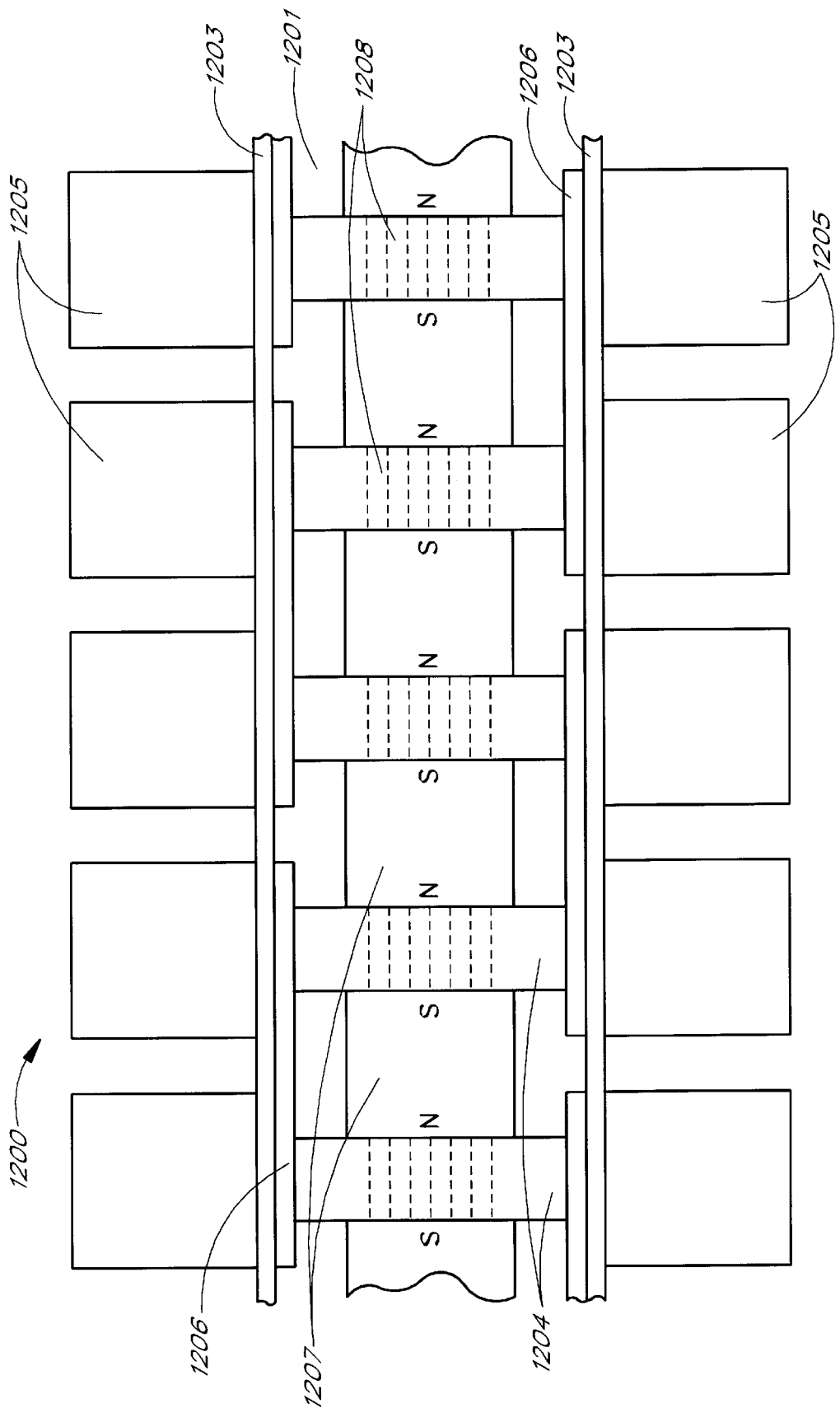
FIG. 12 shows yet another embodiment of the thermoelectric system in accordance with the present invention in which efficiency is further enhanced by virtue of the application of magnetic fields.

As understood in the art, the performance of certain TE materials may be enhanced by the application of suitable magnetic fields. FIG. 12 shows an embodiment of a TE system 1200 in which the material structure of TE elements 1204 is such that a magnetic field is generally applied across the width of the TE elements. As shown, a TE element array 1201 is constructed with a hot side substrate 1202 and a cold side substrate 1203 sandwiching a plurality of TE elements 1204. Heat exchangers 1205 are in good thermal contact with the TE elements 1204 via the hot and cold side substrates 1202 and 1203. As shown, the heat exchangers 1105 are of any suitable configurations such as those described in FIGS. 9A and 9B. In this embodiment, substantial or significant thermal isolation of the TE elements 1204 in the direction of flow is employed as before. Series electrical connection of the TE elements is achieved by circuitry 1206 bonded or otherwise fixed to the hot and cold side substrates 1202 and 1203 and to the TE elements 1204. For example for some TE materials, a suitable magnetic field can be applied from permanent magnets 1207 all oriented in the same direction with respect to their polarity (shown by N for north and S for south in FIG. 12). The magnetic field 1208 (shown by the dashed lines) therefore passes through the widths of the TE elements 1204.

Figure 13:
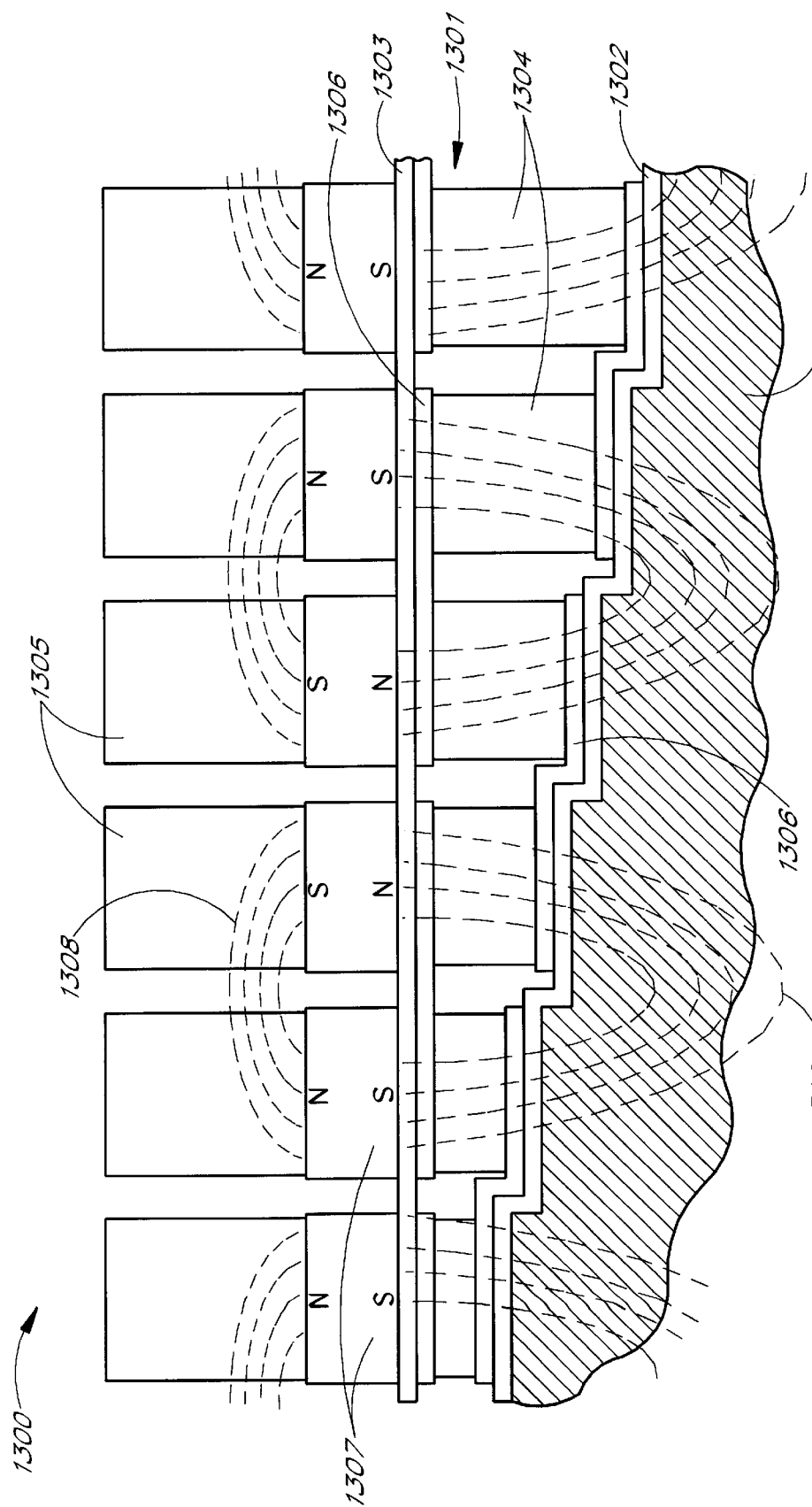
FIG. 13 illustrates yet another embodiment in which the efficiency is further enhanced by the virtue of a magnetic field across the length of the TE elements.

FIG. 13 shows an embodiment of a TE system 1300 in which the material structure of TE elements 1304 is such that enhancement is achieved by the application of a suitable magnetic field across the length of the TE elements. As shown, a TE element array 1301 is constructed with a hot side substrate 1302 and a cold side substrate 1303 sandwiching a plurality of TE elements 1304. In this embodiment, heat exchangers 1305 are in good thermal contact with permanent magnets 1307 which are, in turn, in good thermal contact with the TE elements 1304 via cold side substrate 1303. In one embodiment, the magnets form the heat exchangers. Alternatively, the heat exchangers 1305 are similar to those described in FIGS. 9A and 9B. In this embodiment, substantial or significant thermal isolation of the TE elements 1304 in the direction of flow is employed.

A heat sink 1309 (from the standpoint of the TE system 1300 being substantially infinite) is in good thermal contact with the TE elements 1304 via the hot side substrate 1302. The heat sink 1309 can be made from a material with high magnetic permeability such as iron. Series electrical connection of the TE elements 1304 is achieved by circuitry 1306 bonded or otherwise attached to the hot and cold side substrates 1302 and 1303 and to the TE elements 1304. The magnetic field is applied from the permanent magnets 1307 directionally oriented in pairs with respect to their polarity (shown by N for north and S for south in FIG. 13). The magnetic circuit is completed on the hot side through the high magnetically permeable heat sink 1309. The magnetic field 1308 (shown by the dashed lines) therefore substantially passes through the lengths of the TE elements 1304.

Figure 14:
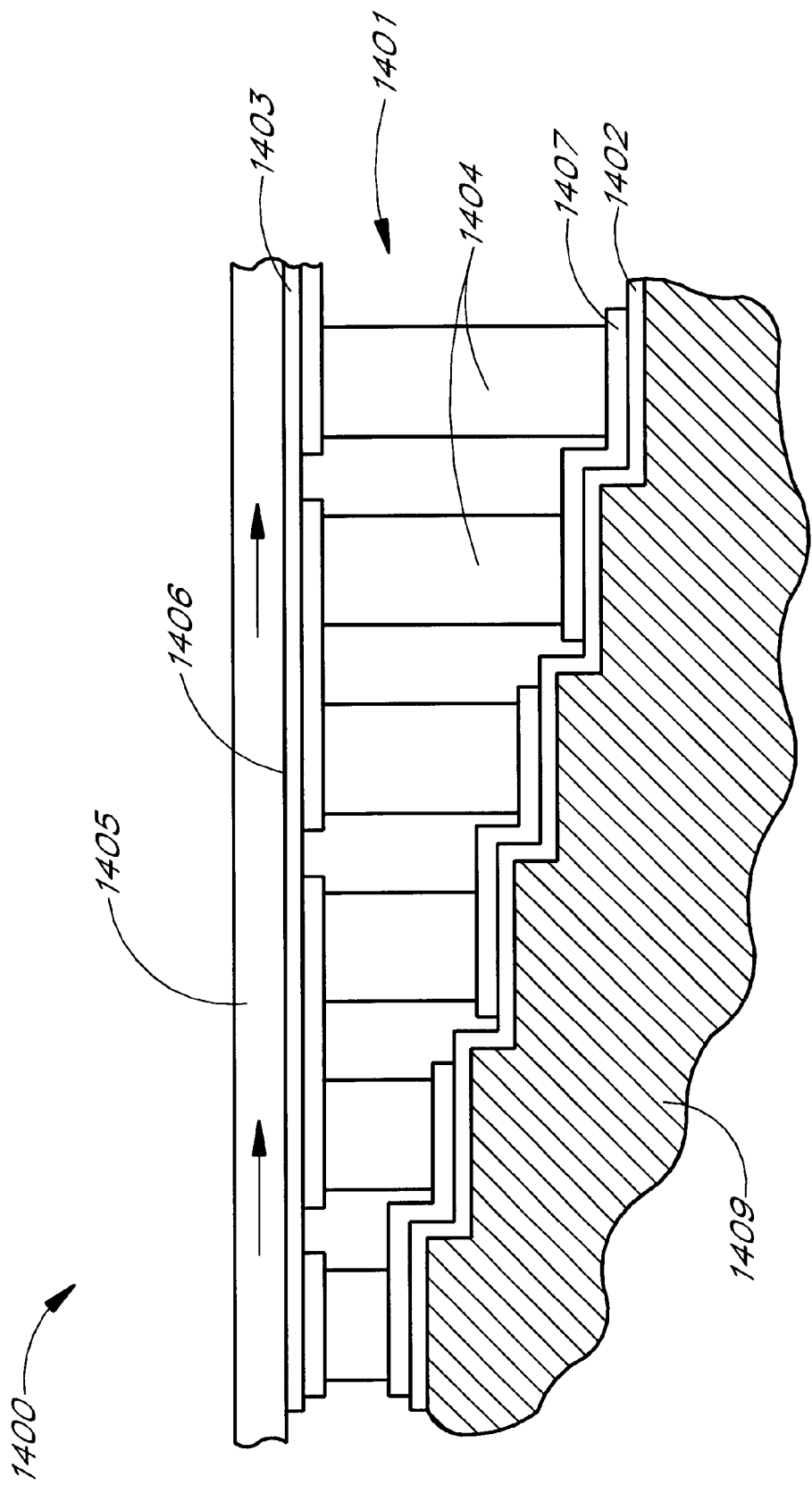
FIG. 14 depicts an illustration of a thermoelectric system in accordance with the present embodiment, where the material to be cooled is a solid rather than a fluid.

In the embodiments disclosed above, the media to which heat is transferred or from which it is extracted has been a fluid. FIG. 14 depicts a construction in which the fluid is replaced by a solid. A TE system 1400 is shown with a TE element array 1401 constructed with a hot side substrate 1402 and a cold side substrate 1403 sandwiching a plurality of TE elements 1404. A heat sink 1409 (from the standpoint of the TE system 1400 being substantially infinite) is in good thermal contact with the TE elements 1404 via the hot side substrate 1402. Series electrical connection of the TE elements 1404 is achieved by circuitry 1407 bonded or otherwise attached to the hot and cold side substrates 1402 and 1403 and to the TE elements 1404. Solid material 1405 (in the case shown) to be cooled moves from left to right in the figure and is in good thermal contact with the TE elements 1404 via the cool side substrate 1403. Good thermal conductivity at the interface between the solid 1405 and the cool side substrate 1403 can be achieved for example by thermal grease 1406. As the solid 1405 passes along the cool side substrate 1403 it is cooled progressively by the TE elements 1404. Advantageously, the solid material has good thermal conductivity from the TE elements 1404 through the substrate 1403 and grease 1406 and through the solid 1405 but not along the solid in the direction of motion. Suitable materials for the solid 1405 can be composites or other thermally anisotropic materials, or the solid 1405 can be slotted perpendicular to the direction of motion and the slots filled with a thermal insulator, as examples.

Figure 15E:
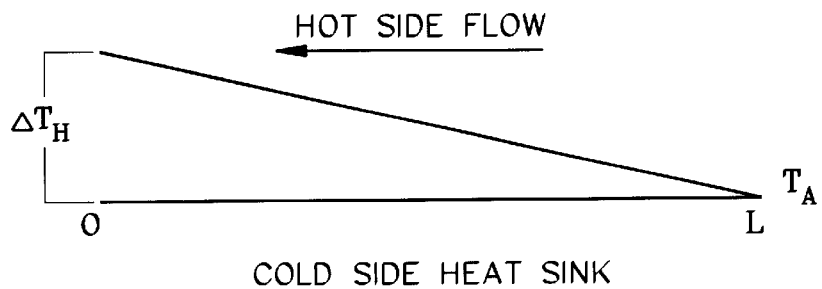
Figure 15F:
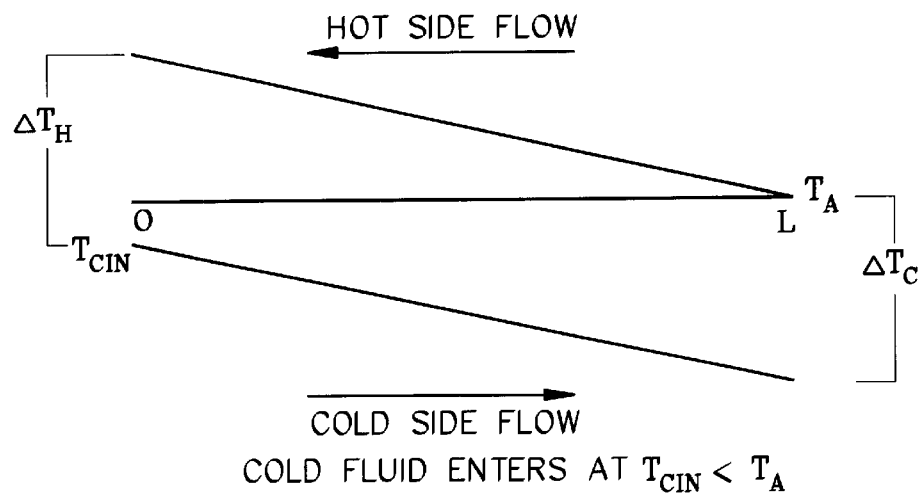
Figure 15G:
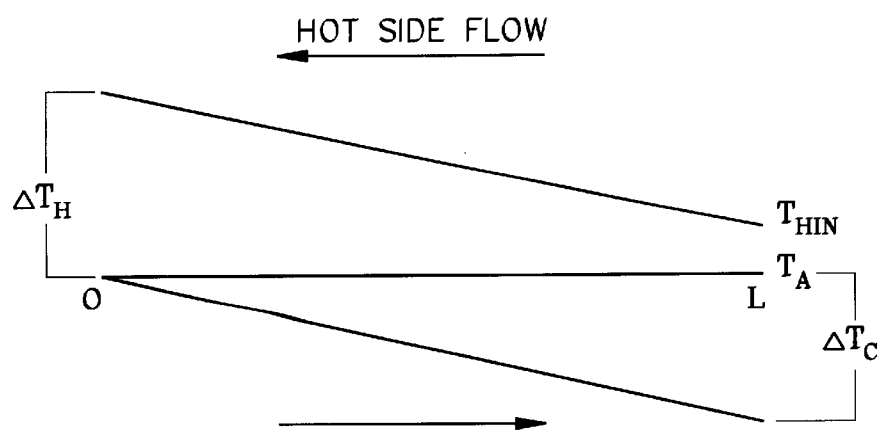

FIGS. 15A through 15G show examples of various temperature profiles along the length of an isolated element TE system. In all of these figures, hot side flow is depicted as from right to left and cold side flow is from left to right. For those cases in which one side has a heat sink, there is no flow on the side with the heat sink. Point O is always at the left representing the entry end for cold side flow and the exit end for hot side flow. Point L is always at the right representing the exit end for cold side flow and the entry end for hot side flow. The horizontal line always represents ambient temperature, $T_A$. FIG. 15A depicts the case in which $\Delta T_C = \Delta T_H$. FIG. 15B depicts the case in which $\Delta T_C > \Delta T_H$. FIG. 15C depicts the case in which $\Delta T_C < \Delta T_H$. FIG. 15D depicts the case in which the hot side has an infinite heat sink and therefore $\Delta T_H = 0$. FIG. 15E depicts the case in which the cold side has an infinite heat sink and therefore $\Delta T_C = 0$. FIG. 15F depicts the case in which cold fluid enters at a temperature $T_{CIN} < T_A$. FIG. 15G depicts the case in which hot fluid enters at a temperature $T_{HIN} > T_A$. Other temperature profiles can be envisioned and devices constructed to produce all possible combinations of heat sinks, input temperatures and output temperatures in accordance with the teachings of the present invention.

In the dual mode operation, the idealized equation (9) illustrates that when the COP in cooling mode is optimized, so is the COP in heating mode; however, the flow rates, the variation in TE element resistance vs. position, or the variation in TE element current vs. position, may no longer be appropriate for the application. The adjustment of these parameters as guided by the fundamental equations of thermoelectrics can be made to optimize overall system performance.

Figure 16:
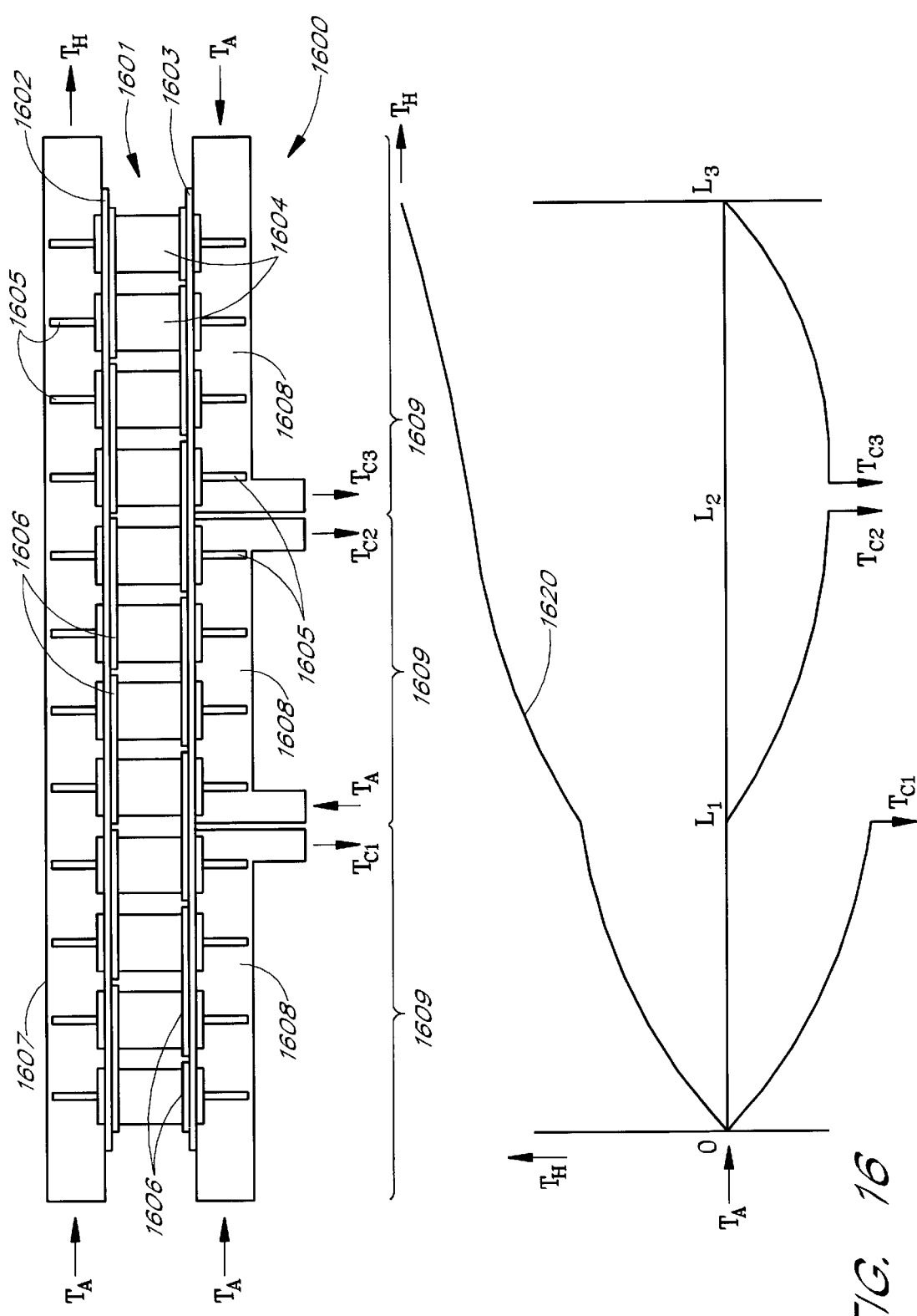
FIG. 16 illustrates yet another embodiment of a thermoelectric system in which the flow on the waste side traverses the length of the thermoelectric array in sections.

FIG. 16 shows another embodiment of a TE system 1600 in which flow on the waste side traverses the length of the TE array 1601 in sections 1609. As with the previous embodiments, the TE array 1601 is constructed with a hot side substrate 1602 and a cool side substrate 1603 sandwiching a plurality of TE elements 1604. A plurality of pins 1605 are in good thermal contact with the TE elements 1604, via both the hot side substrate 1602 and the cool side substrate 1603, and form heat exchangers for the TE system 1600. As shown, the pins 1605 have a form very similar to nails, with their heads 1606 in good thermal contact with the TE elements 1604 (hot and cold side). Preferably, the pins 1605 are constructed of copper or other material having high thermal conductivity. Depending upon the application or the fluids to which heat transfer takes place, the pins 1605 may be replaced with other heat exchanger configurations or geometries some of which have been described above.

The hot side substrate 1602 and the cool side substrate 1603 along with the circuitry 1606 are constructed as described for FIGS. 7A through 7C maintaining the property of thermal isolation of the TE elements 1604 along the length of the TE array 1601. A hot side duct 1607 is attached to the hot side of the TE system 1600 to direct fluid entering at the left at temperature $T_A$ past the heat exchangers 1605 on the hot side, and exiting at the right at temperature $T_H$. A plurality of ducts 1608 are attached to the cold side of the TE system 1600 to direct fluid past a plurality of sections 1609 of heat exchangers 1605. Fluid at temperature $T_A$ enters the leftmost two ducts 1608 at their respective left ends and exits at their respective right ends. Fluid at temperature $T_A$ enters the rightmost duct 1608 at its right end and exits at its left end. The figure shows three sections 1609 in the cool side which is the waste side in the depicted embodiment, but there can be any number and they do not all have to be the same length or flow in the same direction. The cool side exit temperatures, $T_{C1}$, $T_{C2}$, etc. do not have to be the same nor does the amount of fluid passing through each.

Because cool side air is introduced at $T_A$ at a plurality of points along the length of TE system 1600, $\Delta T$ across the TE elements 1604 can be smaller than it would be if the cool side air passed by all of the heat exchangers 1605 on the cool side prior to being exhausted. As shown in Equation 10, the COP is made larger when $\Delta T$ is smaller; therefore the hot side of TE system 1600 can be made even warmer than it would be with a single cool side duct. This is depicted in the temperature profile graph at the bottom of FIG. 16. At each point of introduction of fluid at temperature $T_A$ (the points 0, $L_1$, $L_2$ . . . ) the COP of the previous section has become relatively smaller. The new fluid at $T_A$ raises the COP of the stage into which it is introduced, thereby achieving additional $\Delta T$ throughout that section. Note that generally, the net $\Delta T$ added by each section will diminish down the length of the device unless the fluid introduced at the later stages ($L_2$ etc.) is at a temperature higher than $T_A$, or the heat sinking ability in the later stages is sufficiently large.

The embodiment shown in FIG. 16 showed the TE system operating in heating mode. This same technique can be used to augment the performance of a TE system similarly constructed in cooling mode, wherein the fluid on the waste side enters at more than one point.

Figure 17:
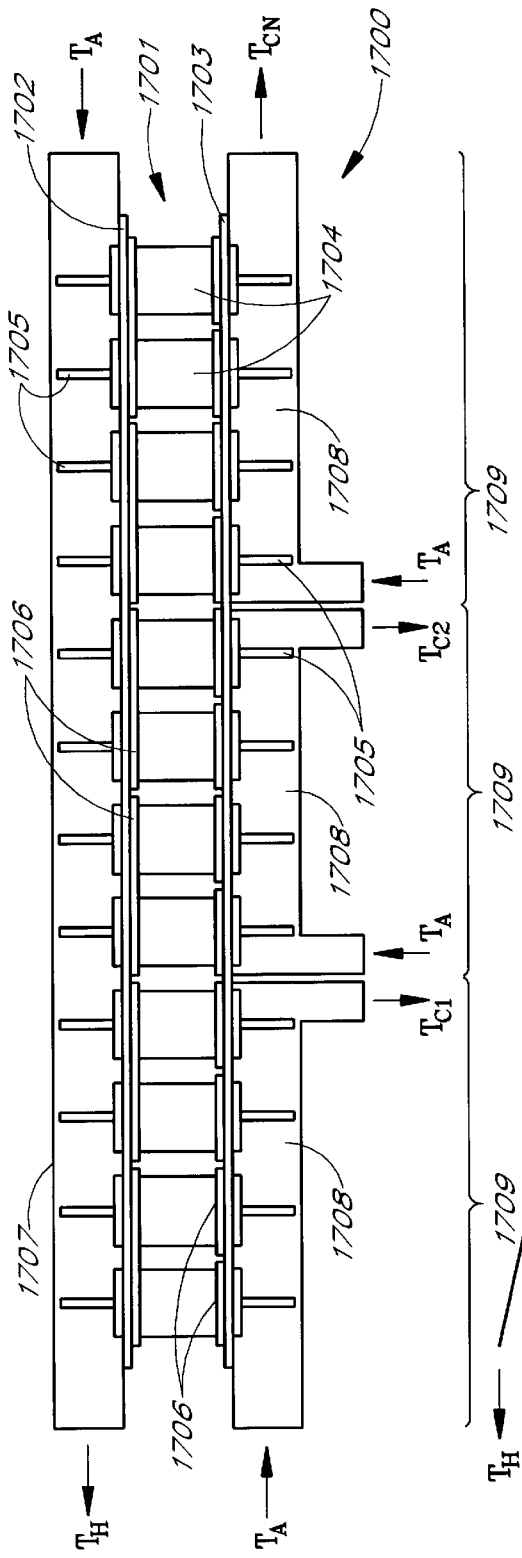
FIG. 17 illustrates yet another embodiment of a thermoelectric system in which flow on the waste side traverses the length of the array in sections, but differs from FIG. 16 in that the flow is from opposite ends.
Figure 17:
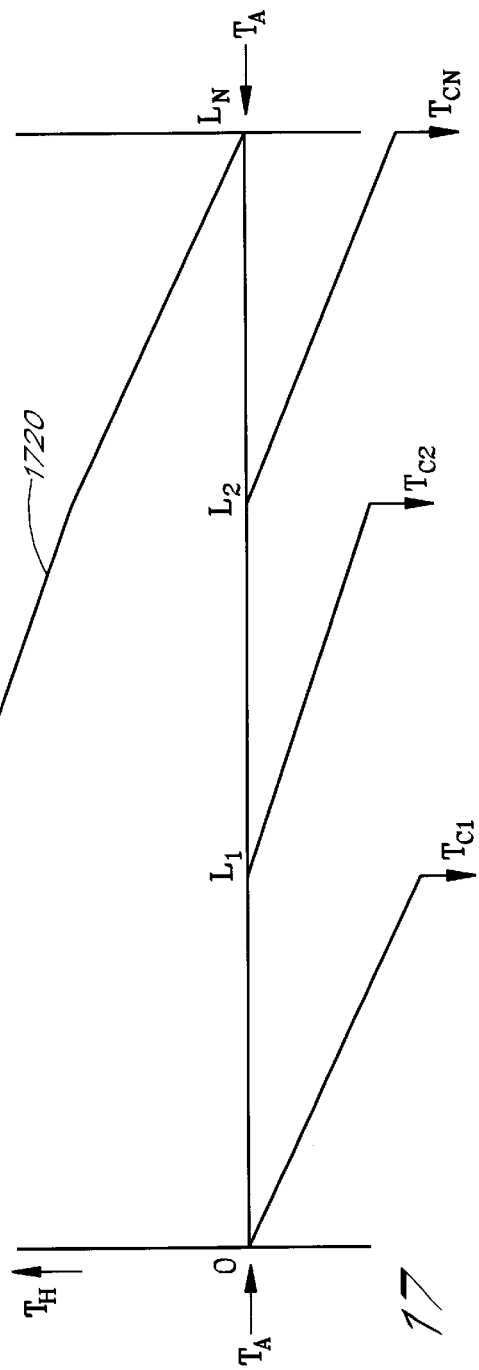

FIG. 17 shows another embodiment of a TE system 1700 in which flow on the waste side (cooling side) traverses the length of the TE array 1701 in sections 1709. FIG. 17 differs from FIG. 16 in that in FIG. 17, the flow is from opposite ends of the TE system 1700. The TE array 1701 is constructed with a hot side substrate 1702, cool side substrate 1703, a plurality of pin 1705, circuitry 1706, hot side duct 1707 and plurality of duct 1708 for a plurality of section 1709 of heat exchangers 1705, just as in FIG. 16.

Again, the embodiment shown in FIG. 17 depicts the TE system operating in heating mode. This same technique can be used to augment the performance of a TE system similarly constructed in cooling mode, wherein the fluid on the waste side enters at more than one point. Furthermore, not all of the waste side fluid need flow in the same direction, enter at the same temperature, flow in equally spaced or equal length section, or have the same fluid flow rate.

Figure 18:
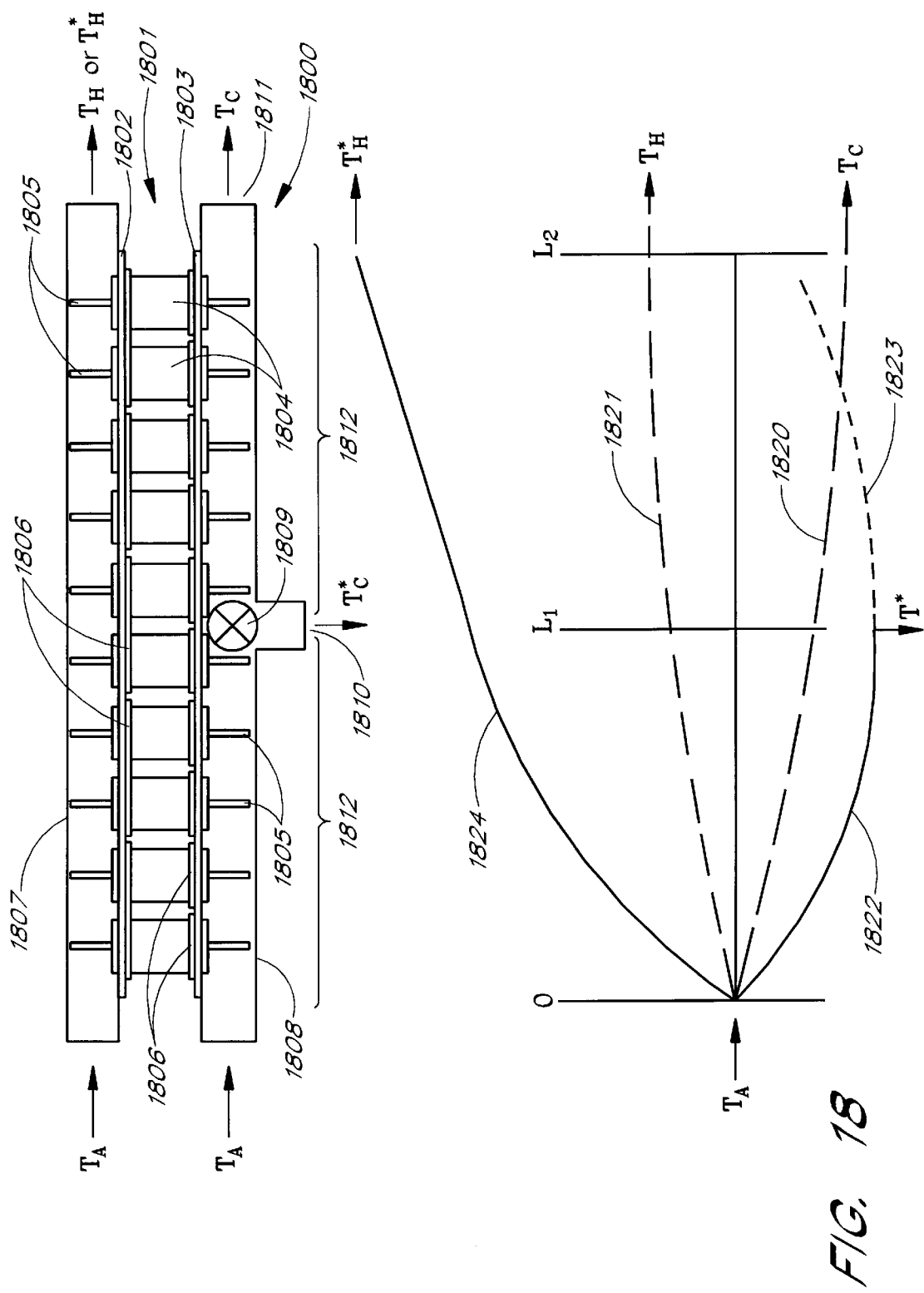
FIG. 18 illustrates yet another embodiment of a thermoelectric system in which flow on the waste side does not traverse the entire length of the array.

FIG. 18 shows another embodiment of a TE system 1800 in which flow on the waste side may not traverse the entire length of the TE array 1801. The TE array 1801 is constructed with a hot side substrate 1802, a cool side substrate 1803, and a plurality of pins 1805 just as in FIG. 16. A hot side duct 1807 is attached to the hot side of the TE system 1800 to direct fluid entering at the left at temperature $T_A$ past the heat exchangers 1805 on the hot side, and exiting at the right at temperature $T_H$. A duct 1808 is attached to the cold side of the TE system 1800 to direct fluid past the heat exchangers 1805. Fluid enters the cool side duct 1808 at temperature $T_A$ at the left end in the figure. A valve 1809 has two positions, one (open) allowing fluid to flow through the entire duct 1808 so that it exits at the right end 1811 at temperature $T_C$. The other position (closed) of the valve 1809 allows the fluid to flow through only a portion of the duct 1808 so that it exits at an intermediate position 1810 at temperature $T_C^*$. The figure shows two sections 1812, but there can be any number and they are not necessarily the same length, have fluid flow in the same direction, or have fluid entering at the same temperature.

If the valve 1809 is in its open position and the TE system 1800 is required to produce only a small ΔT, the temperature profiles are 1820 and 1821 (long dashes) as shown at the bottom of FIG. 18. Note that at the exit point $L_2$ the slope of the cool side curve is non-zero and therefore the heat flow is non-zero. Thus in this situation, the TE system 1800 is still removing heat from the cool side and is still delivering heat to the hot side. If, with the valve still in its open position, the TE system 1800 is required to produce a large ΔT, more power to the TE elements 1804 is necessary for sufficient ΔT, and the cool side temperature profile could approximately follow the curves 1822 and 1823. Note that at some intermediate point $L_1$, the slope of the cool side temperature is effectively zero. If flow is allowed to continue past $L_1$, the cool side temperature would continue along the curve (short dash) 1823. If the valve 1809 is closed, thereby dumping the fluid out the exit point 1810, effectively all of the joule heating except for thermal losses is available to further increase the hot side temperature to $T_H^*$, following the hot side temperature profile 1824.

The technique of removing the flow from a portion of the TE array 1801 may also be employed with the device configured with flow from opposite ends. Further, the valve 1809 and the single cool side duct 1808 may be replaced by a plurality of valves and ducts.

In all of the embodiments described above, there may be a system controller similar to that described for FIGS. 10 and 11. Those descriptions focused on the use of the controller to adjust voltages on TE elements (FIG. 10) and to adjust the position of pistons (FIG. 11). The controller may also use the information from the same or similar sensory inputs along with its hard wired or software relationships to adjust, for example, the current (for series connection of TE elements) or the hot side or cold side flow rates. The relationships may be in the form of look-up tables, formulas, or other algorithmic processes. The use of such a controller therefore offers the opportunity to improve overall efficiency to reduce average input power, or to otherwise change system output.

The controller depicted contemplates the possibility of monitoring several parameters, and dynamically adjusting the system in response to these parameters. However, the control system may be a very simple system, such as a switch, controlled by a user. For example, the control system may be no more than a switch that reverses current in the thermoelectric system to change from cooling to heating, or alters the current to dynamically adjust the amount of current to thereby cause a change in the amount of cooling or heating, with the sensory input being a person who decides the temperature is too hot or too cold.

The above descriptions suggest that each row of TE elements would vary in length, area, resistivity or in power applied. For manufacturability, simplicity, and cost, groups of TE elements could be the same, or constructed as submodules. Thus, not every row need be different. Such simplification would still increase efficiency, with the improvement dependent on how many different sizes, power, levels, etc. would be used.

In the above embodiments, in which a heat sink can be employed, the heat sink can be replaced by a heat pipe or other heat transport mechanism. Thus, the heat sink, or the like could be located remotely, or the assembly could be linked to one or more other assemblies that would extract waste thermal power. In addition, although fluids and solids have been depicted for the medium to be cooled or heated, a combination of fluid and solid, such as a slurry, could also be the medium to be cooled or heated. Finally, the various ways of improving efficiency have been described in combination with the thermal isolation feature. However, the enhancements to efficiency, such as changing resistance, varying current, and others described above may be used together or alone, as appropriate in the particular application.

The embodiments described above have focused the discussion on the cool side or cooling feature of the TE systems presented. By reversing the direction of current flowing through such devices or reversing the output from hot side to cold side, heating, or heating and cooling can also be provided with the same or similar configurations. Optimization for any particular usage will depend upon the specific application for the TE system. Nevertheless, a few potential differences may occur in a particular application:

1) In the heating mode, in automotive, home, and industrial heating systems, for example, the required $ΔT_H$ could be substantially higher than $ΔT_C$;
2) the mass flow ratio (main side to waste side) may require adjustment to optimize performance;
3) the capability of today's TE thermal pumping power limits ΔT across the device to about 70° C., so to achieve high $ΔT_H$ with high COP, configurations and flow patterns may need to be adjusted as required by any particular application; and
4) when the system is required to operate in either heating or cooling mode on demand, (HVAC or heat pump systems) the design advantageously would be sufficiently flexible to operate efficiently in both modes.

What is claimed is:

1. A thermoelectric system for use with at least one medium to be cooled or heated, comprising:
 a plurality of thermoelectric elements forming a thermoelectric array with a cooling side and a heating side, wherein the plurality of thermoelectric elements are substantially thermally isolated from each other in at least one direction across the array; and
 at least one heat exchanger on at least the cooling and/or the heating side in thermal communication with at least one thermoelectric element, the heat exchanger configured to significantly maintain the thermal isolation of the thermoelectric elements.

2. The thermoelectric system of claim 1, wherein the at least one medium moves across at least a portion of at least one side of the array, in at least one direction.

3. The thermoelectric system of claim 2, wherein at least one characteristic of some of the thermoelectric elements is varied in the direction of medium movement.

4. The thermoelectric system of claim 3, wherein the at least one characteristic comprises at least the resistance of at least some of the thermoelectric elements.

5. The thermoelectric system of claim 4, wherein the resistance is varied through variation of length of at least some of the thermoelectric elements.

6. The thermoelectric system of claim 4, wherein the resistance is varied through variation of cross-sectional area of at least some of the thermoelectric elements.

7. The thermoelectric system of claim 4, wherein the resistance is varied through mechanical configuration of at least some of the thermoelectric elements.

8. The thermoelectric system of claim 4, wherein the resistance is varied through resistivity of at least one thermoelectric material.

9. The thermoelectric system of claim 1, wherein the current through the thermoelectric elements is different for at least some thermoelectric elements in the array.

10. The thermoelectric system of claim 2, wherein the heat exchanger comprises a plurality of portions, at least some of the portions in thermal communication with at least one thermoelectric element, at least some of the portions substantially thermally isolated from other of said portions in the direction of medium movement.

11. The thermoelectric system of claim 10, wherein at least some of the portions comprise posts.

12. The thermoelectric system of claim 10, wherein at least some of the portions comprise heat pipes.

13. The thermoelectric system of claim 10, wherein at least some of the portions comprise fins.

14. The thermoelectric system of claim 1, wherein at least one heat exchanger is on each of the cooling and the heating sides.

15. The thermoelectric system of claim 1, wherein one side has a heat sink and one side has the at least one heat exchanger.

16. The thermoelectric system of claim 15, wherein the heat sink is provided by at least one heat pipe on one end in thermal communication with one side of the thermoelectric array and on the other end in thermal communication with a heat sink.

17. The thermoelectric system of claim 1, wherein the thermoelectric elements are subjected to at least one magnetic field.

18. The thermoelectric system of claim 1, wherein the medium comprises at least one fluid.

19. The thermoelectric system of claim 1, wherein the medium comprises at least one solid.

20. The thermoelectric system of claim 1, wherein the medium comprises a combination of at least one fluid and at least one solid.

21. The thermoelectric system of claim 3, wherein the at least one characteristic is dynamically adjustable through adjustment of the mechanical configuration of the thermoelectric system.

22. The thermoelectric system of claim 21, wherein a control system coupled to said thermoelectric system adjusts the mechanical configuration based upon at least one input to the control system.

23. The thermoelectric system of claim 22, wherein the control system operates according to at least one algorithm.

24. The thermoelectric system of claim 3, wherein a control system coupled to said thermoelectric system adjusts the at least one characteristic based upon at least one input to the control system.

25. The thermoelectric system of claim 24, wherein the control system operates according to at least one algorithm.

26. A thermoelectric system for use with a directional movement of at least one medium to be cooled or heated, comprising:
 a plurality of thermoelectric elements forming a thermoelectric array with a cooling side and a heating side, wherein at least one characteristic of at least some of the thermoelectric elements is varied in the direction of medium movement.

27. The thermoelectric system of claim 26, wherein the at least one characteristic comprises at least the resistance of at least some of the thermoelectric elements.

28. The thermoelectric system of claim 27, wherein the resistance is varied through variation of length of at least some of the thermoelectric elements.

29. The thermoelectric system of claim 27, wherein the resistance is varied through variation of cross-sectional area of at least some of the thermoelectric elements.

30. The thermoelectric system of claim 27, wherein the resistance is varied through mechanical configuration of at least some of the thermoelectric elements.

31. The thermoelectric system of claim 27, wherein the resistance is varied through resistivity of at least one thermoelectric material.

32. The thermoelectric system of claim 26, wherein the at least one characteristic is dynamically adjustable through adjustment of the mechanical configuration of the thermoelectric system.

33. The thermoelectric system of claim 32, wherein a control system coupled to said thermoelectric system adjusts the mechanical configuration based upon at least one input to the control system.

34. The thermoelectric system of claim 33, wherein the control system operates in accordance with at least one algorithm.

35. The thermoelectric system of claim 26, wherein the at least one characteristic comprises at least the current through the thermoelectric elements.

36. The thermoelectric system of claim 26, wherein the thermoelectric array has at least one heat exchanger on at least the cooling side or the heating side.

37. The thermoelectric system of claim 36, wherein the heat exchanger comprises a plurality of portions, at least some of the portions in thermal communication with at least one thermoelectric element, at least some of the portions substantially thermally isolated from other of said portions in the direction of medium movement.

38. The thermoelectric system of claim 37, wherein at least some of the portions comprise posts.

39. The thermoelectric system of claim 37, wherein at least some of the portions comprise heat pipes.

40. The thermoelectric system of claim 37, wherein at least some of the portions comprise fins.

41. The thermoelectric system of claim 36, wherein at least one heat exchanger is on each of the cooling side and the heating side.

42. The thermoelectric system of claim 36, wherein one side has a heat sink and the other side has a heat exchanger.

43. The thermoelectric system of claim 26, wherein the thermoelectric elements are subjected to at least one magnetic field.

44. The thermoelectric system of claim 26, wherein the medium comprises at least one fluid.

45. The thermoelectric system of claim 26, wherein the medium comprises at least one solid.

46. The thermoelectric system of claim 26, wherein the at least one medium comprises a combination of at least one fluid and at least one solid.

47. The thermoelectric system of claim 26, wherein a control system coupled to said thermoelectric system adjusts the at least one characteristic based upon at least one input to the control system.

48. The thermoelectric system of claim 47, wherein the control system operates in accordance with at least one algorithm.

49. A method of making an improved thermoelectric system for use with at least one medium to be cooled or heated, comprising the steps of:
    forming a plurality of thermoelectric elements into a thermoelectric array with a cooling side and a heating side; wherein the plurality of thermoelectric elements are substantially thermally isolated from each other in at least one direction across the array; and
    exchanging heat from at least one side of the thermoelectric array in a manner that significantly maintains the thermal isolation of the thermoelectric elements.

50. The method of claim 49, further comprising the step of moving the at least one medium across at least a portion of at least one side of the array in at least one direction.

51. The method of claim 50, further comprising the step of varying at least one characteristic of the thermoelectric elements in the direction of medium movement.

52. The method of claim 51, wherein the step of varying comprises varying at least the resistance of at least some of the thermoelectric elements.

53. The method of claim 52, wherein the step of varying the resistance comprises varying the length of at least some of the thermoelectric elements.

54. The method of claim 52, wherein the step of varying the resistance of the thermoelectric elements comprises varying cross-sectional area of at least some of the thermoelectric elements.

55. The method of claim 52, wherein the step of varying the resistance of the thermoelectric elements comprises varying the mechanical configuration of at least some of the thermoelectric elements.

56. The method of claim 52, wherein the step of varying the resistance of the thermoelectric elements comprises varying resistivity of at least some of the thermoelectric elements.

57. The method of claim 49, further comprising the step of varying the current through at least some thermoelectric elements in the array.

58. The method of claim 50, wherein the step of exchanging heat comprises providing a heat exchanger comprising a plurality of portions, each portion in thermal communication with at least one thermoelectric element, at least some of the portions substantially thermally isolated from other portions in the direction of medium movement.

59. The method of claim 58, wherein at least some of the portions comprise posts.

60. The method of claim 58, wherein at least some of the portions comprise heat pipes.

61. The method of claim 58, wherein at least some of the portions comprise fins.

62. The method of claim 49, wherein the step of exchanging heat comprises exchanging heat on both the cooling side and the heating side.

63. The method of claim 49, further comprising sinking heat from at least one side of the thermoelectric array.

64. The method of claim 49, further comprising the step of subjecting the thermoelectric elements to at least one magnetic field.

65. The method of claim 49, wherein the medium comprises at least one fluid.

66. The method of claim 49, wherein the medium comprises at least one solid.

67. The method of claim 49, wherein the at least one medium comprises a combination of at least one fluid and at least one solid.

68. The method of claim 51, wherein the step of varying comprises dynamically adjusting the at least one characteristic through adjustment of the mechanical configuration of the thermoelectric system.

69. The method of 68, wherein the step of dynamically adjusting comprises evaluating at least one parameter and adjusting in response to the evaluation.

70. The method of claim 69, wherein the step of dynamically adjusting proceeds in accordance with an algorithm in response to at least one sensory input indicative of said at least one parameter.

71. The method of claim 51, further comprising the step of dynamically adjusting the at least one characteristic in response to the evaluation of at least one parameter.

72. The method of claim 71, wherein the step of dynamically adjusting proceeds in accordance with an algorithm responsive to at least one sensory input indicative of said at least one parameter.

73. A thermoelectric system for use with a at least one medium to be cooled or heated, comprising:
    means for forming a plurality of thermoelectric elements into a thermoelectric array with a cooling side and a heating side; wherein the plurality of thermoelectric elements are substantially thermally isolated from each other in at least one direction across the array; and
    means for exchanging heat from at least one side of the thermoelectric array in a manner that significantly maintains the thermal isolation of the thermoelectric elements.

74. The thermoelectric system of claim 73, wherein the at least one medium moves across at least a portion of at least one side of the array in at least one direction.

75. The thermoelectric system of claim 74, wherein at least one characteristic of the thermoelectric elements is varied in the direction of medium movement.

76. The thermoelectric system of claim 75, wherein the at least one characteristic comprises the resistance of at least some of the thermoelectric elements.

77. The thermoelectric system of claim 75, wherein the at least one characteristic comprises the current through at least some thermoelectric elements in the array.

78. The thermoelectric system of claim 74, wherein the means for exchanging heat comprises a heat exchanger.

79. The thermoelectric system of claim 78, wherein the heat exchanger is configured with a plurality of portions each in thermal communication with at least one thermoelectric element, at least some portions of the heat exchanger substantially thermally isolated from other portions of the heat exchanger in the direction of medium movement.

80. The thermoelectric system of claim 79, wherein at least some of the portions comprise posts.

81. The thermoelectric system of claim 79, wherein at least some of the portions comprise fins.

82. The thermoelectric system of claim 79, wherein at least some of the portions comprise heat pipes.

83. The thermoelectric system of claim 73, further comprising a means for sinking heat from at least one side of the thermoelectric array.

84. The thermoelectric system of claim 73, wherein the medium comprises at least one fluid.

85. The thermoelectric system of claim 73, wherein the medium comprises at least one solid.

86. The thermoelectric system of claim 73, wherein the at least one medium comprises a combination of at least one fluid and at least one solid.

87. The thermoelectric system of claim 75, wherein the at least one characteristic is varied by dynamic adjustment.

88. The method of claim 87, wherein the dynamic adjustment proceeds in accordance with an algorithm in response to at least one sensory input indicative of at least one parameter.

* * * * *